(12) United States Patent
Kobayashi et al.

(10) Patent No.: US 10,134,911 B2
(45) Date of Patent: Nov. 20, 2018

(54) SEMICONDUCTOR DEVICE

(71) Applicant: Semiconductor Energy Laboratory Co., Ltd., Atsugi-shi, Kanagawa-ken (JP)

(72) Inventors: Yoshiyuki Kobayashi, Tokyo (JP); Shinpei Matsuda, Kanagawa (JP); Daisuke Matsubayashi, Kanagawa (JP); Hiroyuki Tomisu, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/644,940

(22) Filed: Jul. 10, 2017

(65) Prior Publication Data
US 2017/0309750 A1    Oct. 26, 2017

Related U.S. Application Data

(63) Continuation of application No. 14/812,028, filed on Jul. 29, 2015, now Pat. No. 9,705,004.

(30) Foreign Application Priority Data

Aug. 1, 2014   (JP) .................................. 2014-158032

(51) Int. Cl.
*H01L 29/786*    (2006.01)
*G02F 1/1368*    (2006.01)
(Continued)

(52) U.S. Cl.
CPC ........ *H01L 29/7869* (2013.01); *G02F 1/1368* (2013.01); *H01L 21/8221* (2013.01);
(Continued)

(58) Field of Classification Search
CPC ..... H01L 29/786; H01L 29/04; H01L 29/045; H01L 29/7869; H01L 29/78696;
(Continued)

(56) References Cited

U.S. PATENT DOCUMENTS 5,528,032 A   6/1996 Uchiyama
5,731,856 A   3/1998 Kim et al.
(Continued)

FOREIGN PATENT DOCUMENTS

EP    1737044 A    12/2006
EP    2226847 A    9/2010
(Continued)

OTHER PUBLICATIONS

Kimizuka.N et al., "SPINEL,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

(Continued)

*Primary Examiner* — Chuong A Luu
(74) *Attorney, Agent, or Firm* — Fish & Richardson P.C.

(57) ABSTRACT

A transistor whose channel is formed in a semiconductor having dielectric anisotropy is provided. A transistor having a small subthreshold swing value is provided. A transistor having normally-off electrical characteristics is provided. A transistor having a low leakage current in an off state is provided. A semiconductor device includes an insulator, a semiconductor, and a conductor. In the semiconductor device, the semiconductor includes a region overlapping with the conductor with the insulator positioned therebetween, and a dielectric constant of the region in a direction (Continued)

perpendicular to a top surface of the region is higher than a dielectric constant of the region in a direction parallel to the top surface.

15 Claims, 37 Drawing Sheets

(51) Int. Cl.
*H01L 21/822* (2006.01)
*H01L 27/06* (2006.01)
*H01L 29/04* (2006.01)

(52) U.S. Cl.
CPC ........ *H01L 27/0688* (2013.01); *H01L 29/045* (2013.01); *H01L 29/78696* (2013.01); *G02F 2201/58* (2013.01)

(58) Field of Classification Search
CPC ............... H01L 29/78672; H01L 27/06; H01L 27/10873; H01L 27/1104; G02F 1/1368
USPC .......................................................... 257/43
See application file for complete search history.

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,461,586 B2 | 6/2013 | Yamazaki et al. | |
| 8,654,566 B2 | 2/2014 | Nagatsuka et al. | |
| 8,748,881 B2 | 6/2014 | Yamazaki | |
| 8,779,420 B2 | 7/2014 | Yamazaki | |
| 8,847,326 B2 | 9/2014 | Yamazaki et al. | |
| 8,853,683 B2 | 10/2014 | Miyanaga et al. | |
| 9,214,520 B2 | 12/2015 | Yamazaki | |
| 9,397,153 B2 | 7/2016 | Tanaka et al. | |
| 9,705,004 B2 * | 7/2017 | Kobayashi .......... H01L 29/7869 | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0008474 A1 | 1/2007 | Hashimoto | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0158137 A1 | 7/2008 | Yoshida | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0025676 A1 | 2/2010 | Yamazaki et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2014/0339538 A1 | 11/2014 | Yamazaki et al. | |
| 2014/0339544 A1 | 11/2014 | Hanaoka et al. | |
| 2014/0340608 A1 | 11/2014 | Yamazaki et al. | |
| 2015/0014684 A1 | 1/2015 | Miyanaga et al. | |
| 2015/0084044 A1 | 3/2015 | Tanaka et al. | |
| 2016/0163871 A1 | 6/2016 | Yamazaki | |
| 2016/0329255 A1 | 11/2016 | Miyanaga et al. | |
| 2017/0012135 A1 | 1/2017 | Tanaka et al. | |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 06-275697 A | 9/1994 | |

(56) References Cited

FOREIGN PATENT DOCUMENTS

| | | |
|---|---|---|
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Yamazaki.S et al., "Back-channel-etched thin-film transistor using c-axis-aligned crystal In—Ga—Zn oxide", J. Soc. Inf. Display (Journal of the Society for Information Display), 2014, vol. 22, No. 1, pp. 55-67.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Wrobel.J et al., "Calculations of ZnO properties using the Heyd-Scuseria-Ernzerhof screened hybrid density functional", Phys. Rev. B (Physical Review. B), Oct. 15, 2009, vol. 80, No. 15, pp. 155124-1-155124-8.

Yan.R et al., "Scaling the Si MOSFET: From Bulk to SOI to Bulk", IEEE Transactions on Electron Devices, Jul. 1, 1992, vol. 39, No. 7, pp. 1704-1710.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Colore Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B. (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '03 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Kato.K et al., "Evaluation of Off-State Current Characteristics of Transistor Using Oxide Semiconductor Material, Indium.Gallium. Zinc Oxide", Jpn. J. Appl. Phys. (Japanese Journal of Applied Physics) , 2012, vol. 51, pp. 021201-1-021201-7.
Kobayashi.Y et al., "Effect of Surrounded-Channel Structure on Electrical Characteristics of c-Axis Aligned Crystalline In.Ga.Zn.O Field-Effect Transistor", IEEE Electron Device Letters, Apr. 1, 2015, vol. 36, No. 4, pp. 309-311.
Aoki.T et al., "Electronic Global Shutter CMOS Image Sensor Using Oxide Semiconductor FET With Extremely Low Off-State Current", 2011 Symposium on VLSI Technology : Digest of Technical Papers, 2011, pp. 174-175.

(56) References Cited

OTHER PUBLICATIONS

Inoue.H et al., "Nonvolatile Memory With Extremely Low-Leakage Indium-Gallium-Zinc-Oxide Thin-Film Transistor", IEEE Journal of Solid-State Circuits, Sep. 1, 2012, vol. 47, No. 9, pp. 2258-2265.
Ohmaru.T, "Eight-Bit CPU With Nonvolatile Registers Capable of Holding Data for 40 Days at 85° C. Using Crystalline In—Ga—Zn Oxide Thin Film Transistors", SSDM 2012 (Extended Abstracts of the 2012 International Conference on Solid State Devices and Materials), 2012, pp. 1144-1145.
Onuki.T et al., "DRAM with Storage Capacitance of 3.9 fF using CAAC-OS Transistor with L of 60 nm and having More Than 1-h Retention Characteristics", SSDM 2014 (Extended Abstracts of the 2014 International Conference on Solid State Devices and Materials), Sep. 8, 2014, pp. 430-431.
Kobayashi.Y et al., "Scaling to 50-nm C-Axis Aligned Crystalline In—Ga—Zn Oxide FET with Surrounded Channel Structure and Its Application for Less-Than-5-nsec Writing Speed Memory", 2014 Symposium on VLSI Technology : Digest of Technical Papers, 2014, pp. 170-171.
Kobayashi.Y et al., "Electrical characteristics and short-channel effect of c-axis aligned crystal indium gallium zinc oxide transistor with short channel length", Jpn. J. Appl. Phys. (Japanese Journal of Applied Physics) , 2014, vol. 53, pp. 04EF03-1-04EF03-5.
Matsuda.S et al., "30-nm-Channel-Length C-Axis Aligned Crystalline In—Ga—Zn—O transistors with Low Off-State Leakage Current and Steep Subthreshold Characteristics", 2015 Symposium on VLSI Technology : Digest of Technical Papers, 2015, pp. T216-T217.
Lee.C et al., "Device design guidelines for nano-scale MuGFETs", Solid-State Electronics, 2007, vol. 51, pp. 505-510, Elsevier.

\* cited by examiner

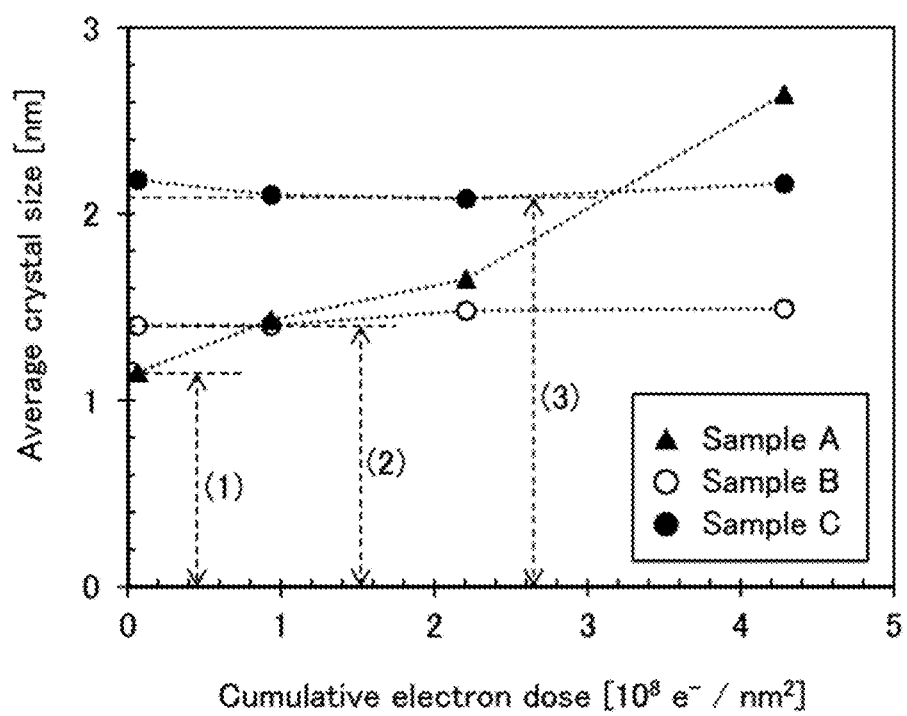

FIG. 26A1
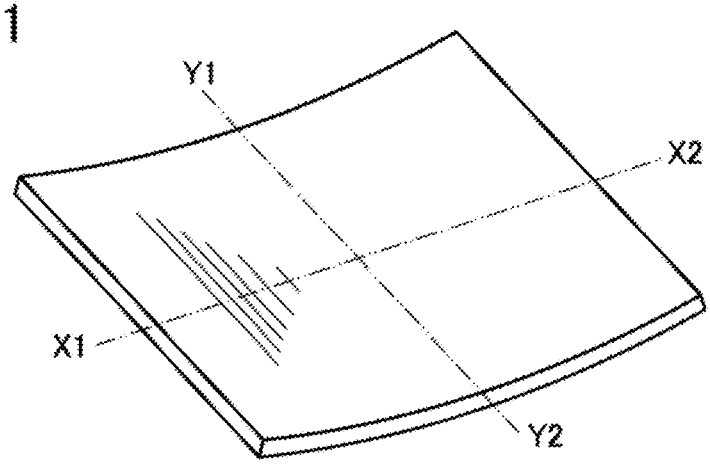
FIG. 26A2
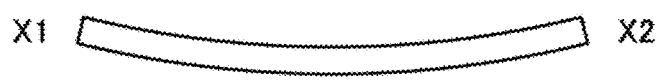
FIG. 26A3
FIG. 26B1
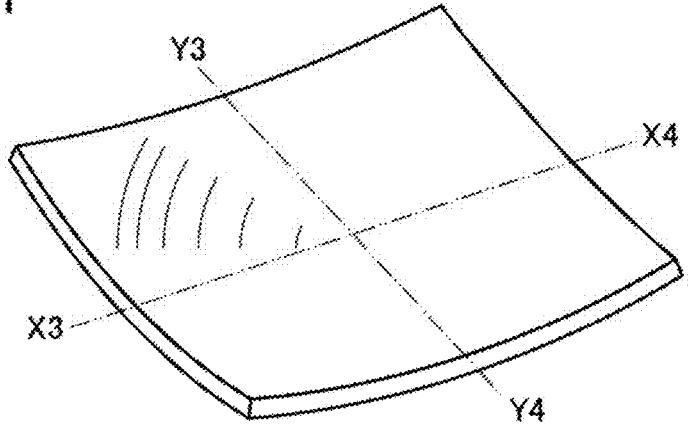
FIG. 26B2
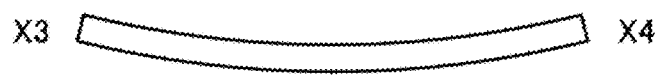
FIG. 26B3
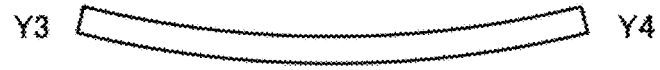

In  Ga  Zn  O

In  Ga  Zn  O

SEMICONDUCTOR DEVICE

CROSS-REFERENCE TO RELATED APPLICATIONS

This application is a continuation of U.S. application Ser. No. 14/812,028, filed Jul. 29, 2015 now U.S. Pat. No. 9,705,004, which claims the benefit of a foreign priority application filed in Japan as Serial No. 2014-158032 on Aug. 1, 2014, both of which are incorporated by reference.

BACKGROUND OF THE INVENTION

1. Field of the Invention

The present invention relates to, for example, a semiconductor, a transistor, and a semiconductor device. The present invention relates to, for example, a method for manufacturing a semiconductor, a transistor, and a semiconductor device. The present invention relates to, for example, a semiconductor, a display device, a light-emitting device, a lighting device, a power storage device, a memory device, a processor, and an electronic device. The present invention relates to a method for manufacturing a semiconductor, a display device, a liquid crystal display device, a light-emitting device, a memory device, and an electronic device. The present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. In the case of a transistor included in a high-performance display device where a driver circuit and a pixel circuit are formed over the same substrate, it is preferable to use polycrystalline silicon, which can be used to form a transistor having a high field-effect mobility. As a method for forming polycrystalline silicon, high-temperature heat treatment or laser light treatment which is performed on amorphous silicon has been known.

In recent years, transistors including oxide semiconductors (typically, In—Ga—Zn oxide) have been actively developed. The transistors including oxide semiconductors have different features from the transistors including amorphous silicon or polycrystalline silicon. For example, a display device to which a transistor including an oxide semiconductor is applied is known to have small power consumption.

An oxide semiconductor film can be formed by a sputtering method or the like, and thus can be used in a transistor included in a large display device. Because a transistor including an oxide semiconductor has high field-effect mobility, a high-performance display device in which a driver circuit and a pixel circuit are formed over the same substrate can be obtained. In addition, there is an advantage that capital investment can be reduced because part of production equipment for a transistor including amorphous silicon can be retrofitted and utilized.

Oxide semiconductors have a long history, and in 1985, synthesis of an In—Ga—Zn oxide crystal was reported (see Non-Patent Document 1). Further, in 1995, it was reported that an In—Ga—Zn oxide has a homologous structure and is represented by a composition formula $InGaO_3(ZnO)_m$ (m is a natural number) (see Non-Patent Document 2).

In 1995, a transistor including an oxide semiconductor was invented, and its electrical characteristics were disclosed (see Patent Document 1).

In 2014, transistors including a crystalline oxide semiconductor was reported (see Non-Patent Documents 3 and 4). The transistors in these reports include a c-axis aligned crystalline oxide semiconductor (CAAC-OS) and thus are capable of mass-production and have high electrical characteristics and reliability.

REFERENCE

Patent Document

[Patent Document 1] Japanese Translation of PCT International Application No. H11-505377

Non-Patent Document

[Non-Patent Document 1] N. Kimizuka, and T. Mohri, *Journal of Solid State Chemistry*, Vol. 60, 1985, pp. 382-384

[Non-Patent Document 2] N. Kimizuka, M. Isobe, and M. Nakamura, *Journal of Solid State Chemistry*, Vol. 116, 1995, pp. 170-178

[Non-Patent Document 3] S. Yamazaki, T. Hirohashi, M. Takahashi, S. Adachi, M. Tsubuku, J. Koezuka, K. Okazaki, Y. Kanzaki, H. Matsukizono, S. Kaneko, S. Mori, and T. Matsuo, *Journal of the Society for Information Display*, Vol. 22, Issue 1, 2014, pp. 55-67

[Non-Patent Document 4] S. Yamazaki, T. Atsumi, K. Dairiki, K. Okazaki, and N. Kimizuka, *ECS Journal of Solid State Science and Technology*, Vol. 3, Issue 9, 2014, pp. Q3012-Q3022

SUMMARY OF THE INVENTION

One object of embodiments of the present invention is to provide a transistor whose channel is formed in a semiconductor having dielectric anisotropy. Another object is to provide a transistor having a small subthreshold swing value. Another object is to provide a transistor having a small short-channel effect. Another object is to provide a transistor having normally-off electrical characteristics. Another object is to provide a transistor having a low leakage current in an off state. Another object is to provide a transistor having excellent electrical characteristics. Another object is to provide a transistor having high reliability. Another object is to provide a transistor having high frequency characteristics.

Another object is to provide a semiconductor device including the transistor. Another object is to provide a module including the semiconductor device. Another object is to provide an electronic device including the semiconductor device or the module. Another object is to provide a novel semiconductor device. Another object is to provide a novel module. Another object is to provide a novel electronic device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a semiconductor device which includes an insulator, a semiconductor, and a conductor. In the semiconductor device, semiconductor includes a region overlapping with the conductor with the insulator positioned therebetween, and a dielectric constant of the region in a direction perpendicular to a top surface of the region is higher than a dielectric constant of the region in a direction parallel to the top surface.

(2) One embodiment of the present invention is the semiconductor device described in (1), in which the region includes a crystal part, and a crystal axis of the crystal part has orientation.

(3) One embodiment of the present invention is the semiconductor device described in (1) or (2), in which the direction parallel to the top surface is a channel width direction.

(4) One embodiment of the present invention is a semiconductor device which includes an insulator, a semiconductor, and a conductor. In the semiconductor device, the semiconductor includes a region overlapping with the conductor with the insulator positioned therebetween, the semiconductor includes a region having a crystal structure, the crystal structure has a first crystal axis and a second crystal axis, and, a dielectric constant in a direction of the first crystal axis is higher than a dielectric constant in a direction of the second crystal axis in the crystal structure.

(5) One embodiment of the present invention is the semiconductor device described in (4), in which the first crystal axis is aligned in a direction parallel to a normal vector of a top surface of the semiconductor.

(6) One embodiment of the present invention is the semiconductor device described in any one of (1) to (5), in which the semiconductor includes an oxide containing one or more elements selected from indium, zinc, and an element M, and the element M is aluminum, gallium, yttrium, or tin.

A transistor whose channel is formed in a semiconductor having dielectric anisotropy can be provided. A transistor having a small subthreshold swing value can be provided. A transistor having a small short-channel effect can be provided. A transistor having normally-off electrical characteristics can be provided. A transistor having a low leakage current in an off state can be provided. A transistor having excellent electrical characteristics can be provided. A transistor having high reliability can be provided. A transistor having high frequency characteristics can be provided.

A semiconductor device including the transistor can be provided. A module including the semiconductor device can be provided. An electronic device including the semiconductor device or the module can be provided. A novel semiconductor device can be provided. A novel module can be provided. A novel electronic device can be provided.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

In the accompanying drawings:

FIG. 13 shows a change of crystal parts of an In—Ga—Zn oxide owing to electron irradiation;

FIGS. 26A1 to 26A3 and FIGS. 26B1 to 26B3 are perspective views illustrating a semiconductor device of one embodiment of the present invention;

DETAILED DESCRIPTION OF THE INVENTION

Figure 1A:
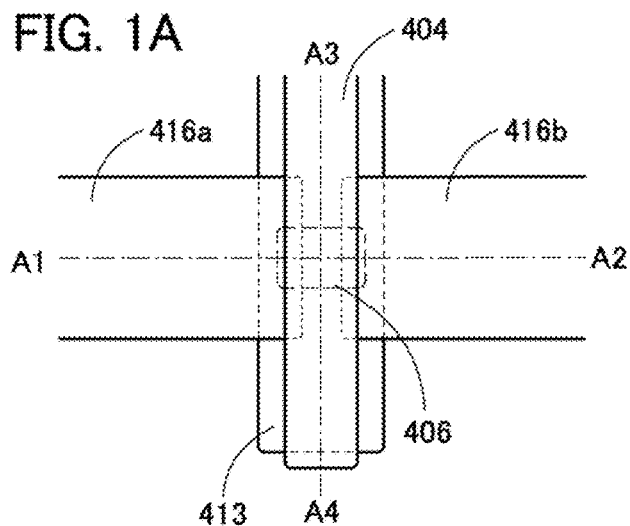
FIGS. 1A to 1C are a plan view, a cross-sectional view, and a perspective view illustrating a transistor of one embodiment of the present invention.

Embodiments of the present invention will be described in detail with the reference to the drawings. However, the present invention is not limited to the following description, and it is easily understood by those skilled in the art that modes and details disclosed herein can be modified in various ways. Furthermore, the present invention is not construed as being limited to description of the following embodiments. In describing structures of the invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). A voltage can be referred to as a potential and vice versa.

Note that the ordinal numbers such as "first" and "second" are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

Note that a "semiconductor" has characteristics of an "insulator" in some cases when the conductivity is sufficiently low, for example. Further, a "semiconductor" and an "insulator" cannot be strictly distinguished from each other in some cases because a border therebetween is not clear. Accordingly, a "semiconductor" in this specification can be called an "insulator" in some cases. Similarly, an "insulator" in this specification can be called a "semiconductor" in some cases.

Further, a "semiconductor" has characteristics of a "conductor" in some cases when the conductivity is sufficiently high, for example. Further, a "semiconductor" and a "conductor" cannot be strictly distinguished from each other in some cases because a border therebetween is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

In this specification, the phrase "A has a region with a concentration B" includes, for example, "the concentration of the entire region in a region of A in the depth direction is B", "the average concentration in a region of A in the depth direction is B", "the median value of a concentration in a region of A in the depth direction is B", "the maximum value of a concentration in a region of A in the depth direction is B", "the minimum value of a concentration in a region of A in the depth direction is B", "a convergence value of a concentration in a region of A in the depth direction is B", and "a concentration in a region of A in which a probable value is obtained in measurement is B".

In this specification, the phrase "A has a region with a size B, a length B, a thickness B, a width B, or a distance B" includes, for example, "the size, the length, the thickness, the width, or the distance of the entire region in a region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region of A in which a probable value is obtained in measurement is B".

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a plan view of a transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the plan view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a plan view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, the values might be different from those calculated by using an effective channel width.

Note that in this specification, the description "A has a shape such that an end portion extends beyond an end portion of B" may indicate, for example, the case where at least one of end portions of A is positioned on an outer side than at least one of end portions of B in a plan view or a cross-sectional view. Thus, the description "A has a shape such that an end portion extends beyond an end portion of B" can be read as the description "one end portion of A is positioned on an outer side than one end portion of B."

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

<Transistor>

A transistor according to one embodiment of the present invention will be described. Note that the transistor is assumed to be of an n-channel type including an oxide semiconductor below. However, another term or the like may be appropriately substituted for a term in the following description when a p-channel transistor is used.

<Structure of Transistor>

Figure 1B:
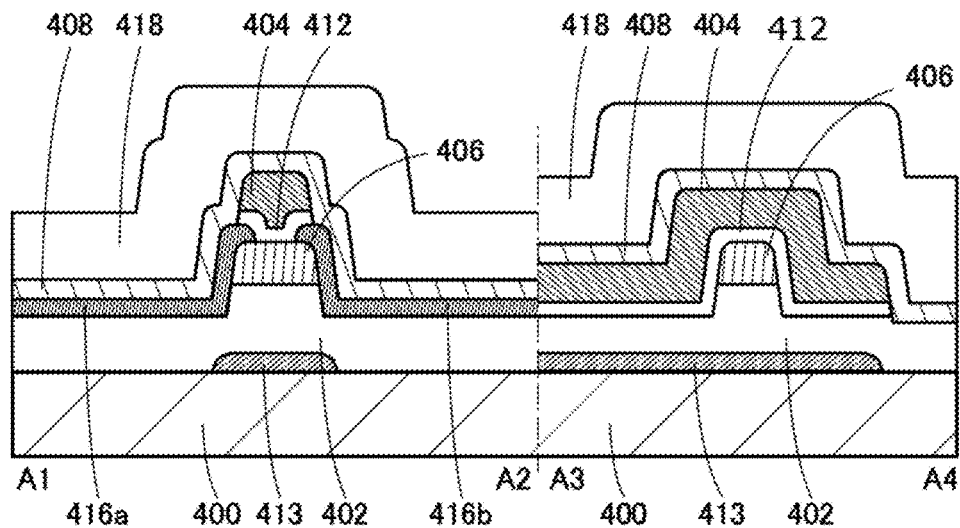

FIGS. 1A and 1B are a plan view and a cross-sectional view of a transistor of one embodiment of the present invention. FIG. 1A is a plan view and FIG. 1B is a cross-sectional view taken along dashed-dotted line A1-A2 and dashed-dotted line A3-A4 in FIG. 1A. Note that for simplification of the drawing, some components are not illustrated in the plan view in FIG. 1A.

The transistor in FIGS. 1A and 1B includes a conductor 413 over a substrate 400, an insulator 402 having a projection over the substrate 400 and the conductor 413, a semiconductor 406 over the projection of the insulator 402, a conductor 416a and a conductor 416b which are in contact with a top surface and a side surface of the semiconductor 406 and which are arranged to be apart from each other, an insulator 412 over the semiconductor 406, the conductor 416a, and the conductor 416b, a conductor 404 over the insulator 412, an insulator 408 over the conductor 416a, the conductor 416b, and the conductor 404, and an insulator 418 over the insulator 408. Here, the conductor 413 is part of the transistor, but is not limited to this. For example, the conductor 413 may be a component independent of the transistor.

The conductor 404 includes a region that faces the top surface and the side surface of the semiconductor 406 with the insulator 412 provided therebetween in the cross section taken along line A3-A4. The conductor 413 includes a region that faces a bottom surface of the semiconductor 406 with the insulator 402 provided therebetween.

The insulator 402 does not necessarily include a projection. The conductor 413, the insulator 408, and/or the insulator 418 is not necessarily provided.

Note that the semiconductor 406 has a function of the channel formation region of the transistor. The conductor 404 functions as a first gate electrode (also referred to as a front gate electrode) of the transistor. The conductor 413 functions as a second gate electrode (also referred to as a back gate electrode) of the transistor. The conductor 416a and the conductor 416b function as a source electrode and a drain electrode of the transistor. The insulator 408 functions as a barrier layer. The insulator 408 has, for example, a function of blocking oxygen and/or hydrogen. Alternatively, the insulator 408 has, for example, a higher capability of blocking oxygen and/or hydrogen than any of the insulator 402, the insulator 412, and the insulator 418.

As illustrated in FIG. 1B, the side surface of the semiconductor 406 is in contact with the conductors 416a and 416b. The semiconductor 406 can be electrically surrounded by an electric field of the conductor 404 (a structure in which a semiconductor is electrically surrounded by an electric field of a conductor is referred to as a surrounded channel (s-channel) structure). Therefore, a channel is formed in the entire semiconductor 406 (the top, bottom, and side surfaces). In the s-channel structure, a large amount of current can flow between a source and a drain of the transistor, so that a high on-state current can be achieved.

In the case where the transistor has the s-channel structure, a channel is formed also in the side surface of the semiconductor 406. Therefore, as the semiconductor 406 has a larger thickness, the channel region becomes larger. In other words, the thicker the semiconductor 406 is, the larger the on-state current of the transistor is. In addition, when the semiconductor 406 is thicker, the proportion of the region with a high carrier controllability increases, leading to a smaller subthreshold swing value. For example, the semiconductor 406 has a region with a thickness greater than or equal to 10 nm, preferably greater than or equal to 20 nm, further preferably greater than or equal to 40 nm, still further preferably greater than or equal to 60 nm, yet further preferably greater than or equal to 100 nm. In addition, to prevent a decrease in the productivity of the semiconductor device, the semiconductor 406 has a region with a thickness, for example, less than or equal to 300 nm, preferably less than or equal to 200 nm, further preferably less than or equal to 150 nm. In some cases, when the channel formation region is reduced in size, electrical characteristics of the transistor with a smaller thickness of the semiconductor 406 may be improved. Therefore, the semiconductor 406 may have a thickness less than 10 nm.

The s-channel structure is suitable for a miniaturized transistor because a high on-state current can be achieved. A semiconductor device including the miniaturized transistor can have a high integration degree and high density. For example, the transistor includes a region having a channel length of preferably less than or equal to 40 nm, further preferably less than or equal to 30 nm, still further preferably less than or equal to 20 nm and a region having a channel width of preferably less than or equal to 40 nm, further preferably less than or equal to 30 nm, still further preferably less than or equal to 20 nm.

Figure 1C:
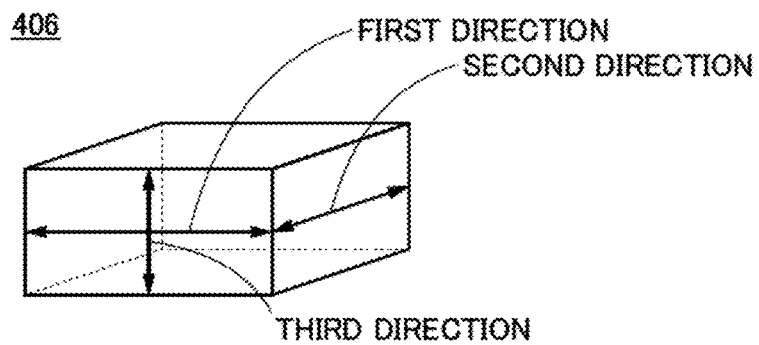

Here, the semiconductor 406 is a semiconductor having dielectric anisotropy. As illustrated in FIG. 1C, when the semiconductor 406 is assumed to be a rectangular solid, the semiconductor 406 has a dielectric constant in a first direction, a dielectric constant in a second direction, and a dielectric constant in a third direction, for example. The first direction, the second direction, and the third direction are perpendicular to one another. Note that the dielectric constant in the first direction is the dielectric constant in a direction parallel to the top surface or the bottom surface of the semiconductor 406. The dielectric constant in the second direction is the dielectric constant in a direction parallel to the top surface or the bottom surface of the semiconductor 406. The dielectric constant in the third direction is the dielectric constant in a direction perpendicular to the top surface or the bottom surface of the semiconductor 406. Note that the dielectric constant in the first direction is the dielectric constant in the channel length direction, the dielectric constant in the second direction is the dielectric constant in the channel width direction, and the dielectric constant in the third direction is the dielectric constant in the thickness direction.

For example, in the semiconductor 406, the dielectric constant in the first direction, the dielectric constant in the second direction, and the dielectric constant in the third direction are different from one another. Alternatively, in the semiconductor 406, the dielectric constant in the first direction is different from the dielectric constant in the second direction. Alternatively, in the semiconductor 406, the dielectric constant in the second direction is different from the dielectric constant in the third direction. Further alternatively, in the semiconductor 406, the dielectric constant in the first direction is different from the dielectric constant in the third direction.

Note that in the semiconductor 406, the dielectric constant in the first direction and/or the second direction is preferably lower than the dielectric constant in the third direction for the following reason.

Because the transistor illustrated in FIGS. 1A to 1C has a high dielectric constant in the direction perpendicular to the top surface of the semiconductor 406, that is, in the third direction, the channel formed in the top surface of the semiconductor 406 is deep (thick) in most cases. As the channel becomes deeper, the carrier controllability in the entire semiconductor 406 in the depth direction is increased and thus the subthreshold swing value can be decreased. This enables an increase in the thickness of the semiconductor 406. When the semiconductor 406 is thicker, the channel formed in the side surface of the semiconductor 406 can be larger. In other words, the effective channel width can be increased, and therefore the on-state current of the transistor can become larger.

Thus, the dielectric anisotropy of the channel formation region can result in favorable electrical characteristics.

Moreover, from the viewpoint described below, the dielectric constant in the first direction and/or the second direction is preferably lower than the dielectric constant in the third direction in the semiconductor 406.

For example, when the drain voltage is increased, a pinch-off point moves to the source side owing to the spread of a depletion layer, decreasing the effective channel length. This is called "channel length modulation effect". The channel length modulation effect affects more as the transistor becomes minuter.

Furthermore, when the transistor is miniaturized to have a smaller channel length, degradation in electrical characteristics such as a reduction in threshold voltage arises. This is called "short-channel effect". For example, when the drain voltage is increased, the potential of the channel formation region is lowered, which decreases the threshold voltage. This is called "drain-induced barrier lowering (DIBL)". As described above, as the drain voltage becomes higher, the channel length modulation effect occurs more and the effective channel length decreases. In a minute transistor, when a depletion layer that is generated by an electric field from a drain reaches a source, a flow of a current (drain current) occurs between the source and the drain without the electric field from a gate. This is called "punch-through phenomenon".

In this way, the increase in drain voltage might cause degradation in electrical characteristics of transistors. To suppress such influences of the drain voltage, it is preferable to use the semiconductor 406 having a low dielectric constant in the first direction and/or the second direction.

The insulator 402 is preferably an insulator containing excess oxygen.

The insulator containing excess oxygen means an insulator from which oxygen is released by heat treatment, for example. For example, a silicon oxide layer containing excess oxygen is a silicon oxide layer which can release oxygen by heat treatment or the like. Therefore, the insulator 402 is an insulator in which oxygen can be moved. In other words, the insulator 402 may be an insulator having an oxygen-transmitting property. For example, the insulator 402 may be an insulator having a higher oxygen-transmitting property than the semiconductor 406.

The insulator containing excess oxygen has a function of reducing oxygen vacancies in the semiconductor 406 in some cases. Such oxygen vacancies form DOS in the semiconductor 406 and serve as hole traps or the like. In addition, hydrogen comes into the site of such oxygen vacancies and forms electrons serving as carriers. Therefore, by reducing the oxygen vacancies in the semiconductor 406, the transistor can have stable electrical characteristics.

Here, an insulator from which oxygen is released by heat treatment may release oxygen, the amount of which is higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ (converted into the number of oxygen atoms) in TDS analysis in the range of a surface temperature of higher than or equal to 100° C. and lower than or equal to 700° C. or higher than or equal to 100° C. and lower than or equal to 500° C.

Here, the method for measuring the amount of released oxygen by TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal.

$$N_{O2} = N_{H2}/S_{H2} \times S_{O2} \times \alpha$$

The value $N_{H2}$ is obtained by conversion of the number of hydrogen molecules desorbed from the reference sample into densities. The value $S_{H2}$ is the integral value of ion intensity in the case where the reference sample is subjected to the TDS analysis. Here, the reference value of the reference sample is set to $N_{H2}/S_{H2}$. The value $S_{O2}$ is the integral value of ion intensity when the measurement sample is analyzed by TDS. The value a is a coefficient affecting the ion intensity in the TDS analysis. Refer to Japanese Published Patent Application No. H6-275697 for details of the above formula. The amount of released oxygen is measured with a thermal desorption spectroscopy apparatus produced by ESCO Ltd., EMD-WA1000S/W using a silicon substrate containing hydrogen atoms at $1 \times 10^{16}$ atoms/cm$^2$, for example, as the reference sample.

Furthermore, in the TDS analysis, oxygen is partly detected as an oxygen atom. The ratio between oxygen molecules and oxygen atoms can be calculated from the ionization rate of oxygen molecules. Note that since the above a includes the ionization rate of oxygen molecules, the amount of released oxygen atoms can also be estimated through the evaluation of the amount of released oxygen molecules.

Note that $N_{O2}$ is the amount of released oxygen molecules. The amount of released oxygen in the case of being converted into oxygen atoms is twice the amount of released oxygen molecules.

Furthermore, the insulator from which oxygen is released by heat treatment may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in ESR.

The insulator containing excess oxygen may be formed using oxygen-excess silicon oxide (SiO$_x$ (X>2)). In the oxygen-excess silicon oxide (SiO$_x$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

Furthermore, by applying a lower voltage or a higher voltage than a source electrode to the conductor 413, the threshold voltage of the transistor may be shifted in the positive direction or the negative direction. For example, by shifting the threshold voltage of the transistor in the positive direction, a normally-off transistor in which the transistor is in a non-conduction state (off state) even when the gate voltage is 0 V can be achieved in some cases. The voltage applied to the conductor 413 may be a variable or a fixed voltage. When the voltage applied to the conductor 413 is a variable, a circuit for controlling the voltage may be electrically connected to the conductor 413.

By placing a semiconductor over and under the semiconductor 406, electrical characteristics of the transistor can be increased in some cases. The semiconductor 406 and semiconductors placed over and under the semiconductor 406 will be described in detail below with reference to FIGS. 2A to 2E.

Figure 2A:
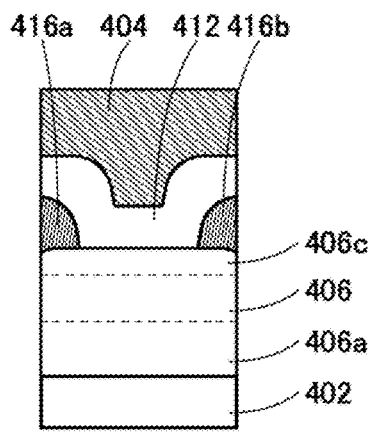
FIGS. 2A to 2D and FIG. 2E are cross-sectional views and a band diagram, respectively, each illustrating a transistor of one embodiment of the present invention.
Figure 2B:
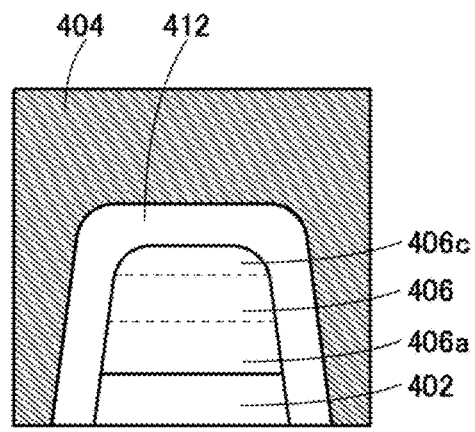

FIG. 2A is an enlarged cross-sectional view illustrating the semiconductor 406 and its vicinity of the transistor illustrated in FIG. 1B in the channel length direction. FIG. 2B is an enlarged cross-sectional view illustrating the semiconductor 406 and its vicinity of the transistor illustrated in FIG. 1B in the channel width direction.

In the transistor structure illustrated in FIGS. 2A and 2B, a semiconductor 406a is placed between the insulator 402 and the semiconductor 406. In addition, a semiconductor 406c is placed between the semiconductor 406 and the conductors 416a and 416b and between the semiconductor 406 and the insulator 412.

Figure 2C:
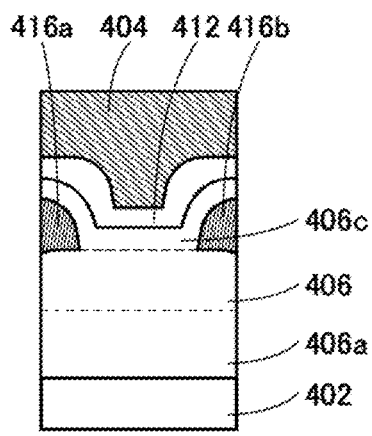
Figure 2D:
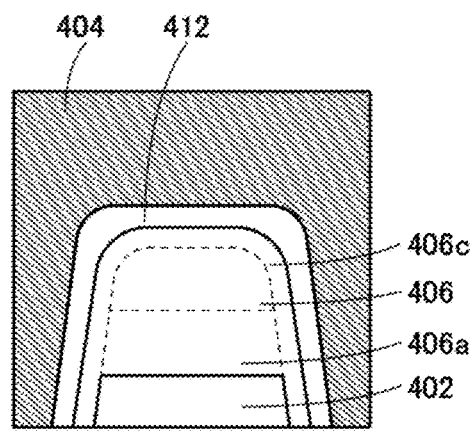
Figure 2E:
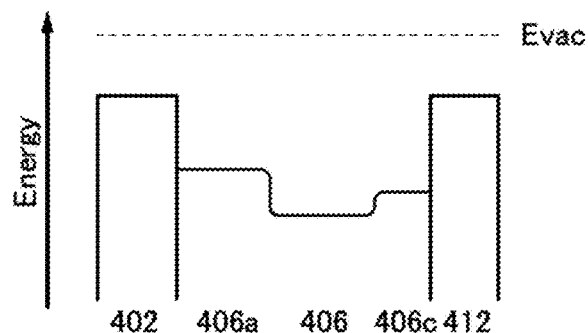

Alternatively, the transistor may have a structure illustrated in FIGS. 2C and 2D.

FIG. 2C is an enlarged cross-sectional view illustrating the semiconductor 406 and its vicinity of the transistor illustrated in FIG. 1B in the channel length direction. FIG. 2D is an enlarged cross-sectional view illustrating the semiconductor 406 and its vicinity of the transistor illustrated in FIG. 1B in the channel width direction.

In the transistor structure illustrated in FIGS. 2C and 2D, the semiconductor 406a is placed between the insulator 402 and the semiconductor 406. In addition, the semiconductor 406c is placed between the insulator 412 and the conductors 416a and 416b, the semiconductor 406, the semiconductor 406a, and the insulator 402.

The semiconductor 406 is an oxide semiconductor containing indium, for example. The oxide semiconductor 406 can have high carrier mobility (electron mobility) by containing indium, for example. The semiconductor 406 preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 406 preferably contains zinc. When the oxide semiconductor contains zinc, the oxide semiconductor is easily crystallized, in some cases.

Note that the semiconductor 406 is not limited to the oxide semiconductor containing indium. The semiconductor 406 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406, an oxide with a wide energy gap may be used, for example. For example, the energy gap of the semiconductor 406 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

For example, the semiconductor 406a and the semiconductor 406c are oxide semiconductors including one or more elements, or two or more elements other than oxygen included in the semiconductor 406. Since the semiconductor 406a and the semiconductor 406c each include one or more elements, or two or more elements other than oxygen included in the semiconductor 406, a defect state is less likely to be formed at the interface between the semiconductor 406a and the semiconductor 406 and the interface between the semiconductor 406 and the semiconductor 406c.

The semiconductor 406a, the semiconductor 406, and the semiconductor 406c preferably include at least indium. In the case of using an In-M-Zn oxide as the semiconductor 406a, when a summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 406, when a summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the semiconductor 406c, when a summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the semiconductor 406c may be an oxide that is of the same type as the oxide of the semiconductor 406a. Note that the semiconductor 406a and/or the semiconductor 406c do/does not necessarily contain indium in some cases. For example, the semiconductor 406a and/or the semiconductor 406c may be gallium oxide. Note that the atomic ratios of the elements included in the semiconductor 406a, the semiconductor 406, and the semiconductor 406c are not necessarily simple ratios of integers.

As the semiconductor 406, an oxide having an electron affinity higher than those of the semiconductors 406a and 406c is used. For example, as the semiconductor 406, an oxide having an electron affinity higher than those of the semiconductors 406a and 406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum.

An indium gallium oxide has small electron affinity and a high oxygen-blocking property. Therefore, the semiconductor 406c preferably includes an indium gallium oxide. The gallium atomic ratio [Ga/(In+Ga)] is, for example, higher than or equal to 70%, preferably higher than or equal to 80%, further preferably higher than or equal to 90%.

At this time, when a gate voltage is applied, a channel is formed in the semiconductor 406 having the highest electron affinity in the semiconductors 406a, 406, and 406c.

Here, in some cases, there is a mixed region of the semiconductor 406a and the semiconductor 406 between the semiconductor 406a and the semiconductor 406. Furthermore, in some cases, there is a mixed region of the semiconductor 406 and the semiconductor 406c between the semiconductor 406 and the semiconductor 406c. The mixed region has a low density of defect states. For that reason, the stack including the semiconductor 406a, the semiconductor 406, and the semiconductor 406c has a band structure where energy is changed continuously at each interface and in the vicinity of the interface (continuous junction) (see FIG. 2E). Note that boundaries of the semiconductor 406a, the semiconductor 406, and the semiconductor 406c are not clear in some cases.

At this time, electrons move mainly in the semiconductor 406, not in the semiconductor 406a and the semiconductor 406c. As described above, when the density of defect states at the interface between the semiconductor 406a and the semiconductor 406 and the density of defect states at the interface between the semiconductor 406 and the semiconductor 406c are decreased, electron movement in the semiconductor 406 is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 μm×1 μm of a top surface or a bottom surface of the semiconductor 406 (a formation surface; here, the semiconductor 406a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P–V) with the measurement area of 1 μm×1 μm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

The electron movement is also inhibited, for example, in the case where the density of defect states is high in a region where a channel is formed.

For example, in the case where the semiconductor 406 contains oxygen vacancies (also denoted by $V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor 406, the on-state current of the transistor can be increased in some cases.

Furthermore, in the case where the density of defect states is high in a region where a channel is formed, electrical characteristics of the transistor vary in some cases. For example, in the case where the defect states serve as carrier generation sources, the threshold voltage of the transistor might vary.

To decrease oxygen vacancies in the semiconductor 406, for example, there is a method in which excess oxygen in the insulator 402 is moved to the semiconductor 406 through the semiconductor 406a. In this case, the semiconductor 406a is preferably a layer having an oxygen-transmitting property (a layer through which oxygen passes or is transmitted).

Moreover, the thickness of the semiconductor 406c is preferably as small as possible to increase the on-state current of the transistor. For example, the semiconductor 406c is formed to include a region having a thickness of less than 10 nm, preferably less than or equal to 5 nm, further preferably less than or equal to 3 nm. Meanwhile, the semiconductor 406c has a function of blocking entry of elements other than oxygen (such as hydrogen and silicon) included in the adjacent insulator into the semiconductor 406 where a channel is formed. For this reason, it is preferable that the semiconductor 406c have a certain thickness. For example, the semiconductor 406c is formed to include a region having a thickness of greater than or equal to 0.3 nm, preferably greater than or equal to 1 nm, further preferably greater than or equal to 2 nm. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. For example, the semiconductor 406a includes a region with a thickness of, for example, greater than or equal to 10 nm, preferably greater than or equal to 20 nm, further preferably greater than or equal to 40 nm, still further preferably greater than or equal to 60 nm. When the thickness of the semiconductor 406a is made large, a distance from an interface between the adjacent insulator and the semiconductor 406a to the semiconductor 406 in which a channel is formed can be large. Since the productivity of the semiconductor device might be decreased, the semiconductor 406a has a region with a thickness of, for example, less than or equal to 200 nm, preferably less than or equal to 120 nm, further preferably less than or equal to 80 nm. Note that the dielectric constant of the semiconductor 406c is preferably as high as possible. The high dielectric constant of the semiconductor 406c can increase the intensity of an electric field applied from the conductor 404 to the semiconductor 406. Furthermore, the semiconductor 406c preferably has dielectric anisotropy. For example, the dielectric constant in the direction of the normal to a formation surface of the semiconductor 406c is preferably higher than the dielectric constant in a direction perpendicular to the direction of the normal to the formation surface. The direction of the normal to the formation surface of the semiconductor 406c is the direction in which the semiconductor 406 and the conductor 404 face each other. Thus, in the case where the dielectric constant in this direction is high, the intensity of an electric field applied from the conductor 404 to the semiconductor 406 can be increased. As a result, electrical characteristics of the transistor can be improved.

For example, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 406 and the semiconductor 406a. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 406 and the semiconductor 406c.

The semiconductor 406 includes a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. It is preferable to reduce the hydrogen concentration in the semiconductor 406a and the semiconductor 406c in order to reduce the hydrogen concentration in the semiconductor 406. The semiconductor 406a and the semiconductor 406c each includes a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. Furthermore, the semiconductor 406 includes a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$. It is preferable to reduce the nitrogen concentration in the semiconductor 406a and the semiconductor 406c in order to reduce the nitrogen concentration in the semiconductor 406. The semiconductor 406a and the semiconductor 406c includes a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$.

The above three-layer structure is an example. For example, a two-layer structure without the semiconductor 406a or the semiconductor 406c may be employed. Alternatively, a four-layer structure in which any one of the semiconductors described as examples of the semiconductor 406a, the semiconductor 406, and the semiconductor 406c is provided under or over the semiconductor 406a or under or over the semiconductor 406c may be employed. An n-layer structure (n is an integer of 5 or more) in which one or more of the semiconductors described as examples of the semiconductor 406a, the semiconductor 406, and the semiconductor 406c is provided at two or more of the following positions: over the semiconductor 406a, under the semiconductor 406a, over the semiconductor 406c, and under the semiconductor 406c.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing a transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The thickness of the substrate 400 is, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate 400 has a small thickness, the weight of the semiconductor device can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

The conductor 413 may be formed to have a single-layer structure or a stacked-layer structure using a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten, for example. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 402 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 402 may have a function of preventing diffusion of impurities from the substrate 400. In the case where the semiconductor 406 is an oxide semiconductor, the insulator 402 can have a function of supplying oxygen to the semiconductor 406.

Each of the conductor 416a and the conductor 416b may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 412 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor 404 may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 408 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 408 may be preferably formed to have, for example, a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

The insulator 418 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 418 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Figure 3A:
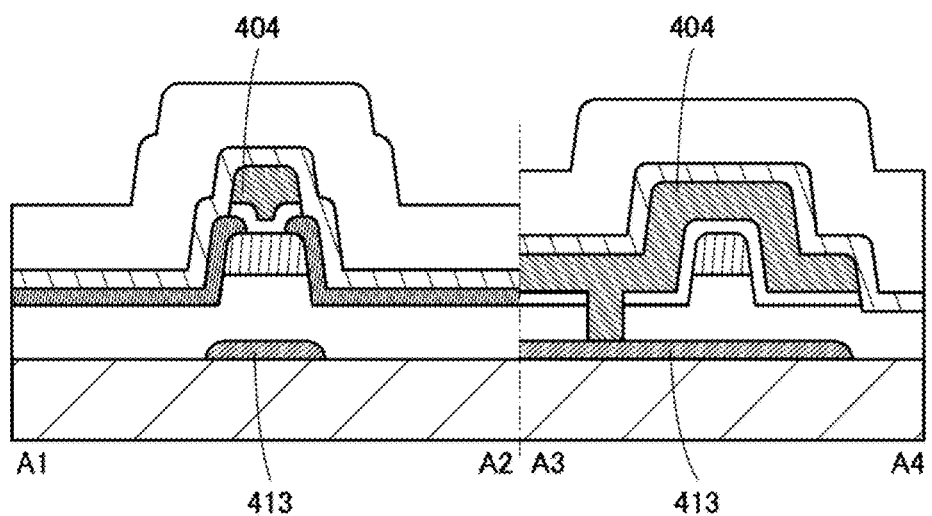
FIGS. 3A and 3B are cross-sectional views each illustrating a transistor of one embodiment of the present invention.
Figure 3B:
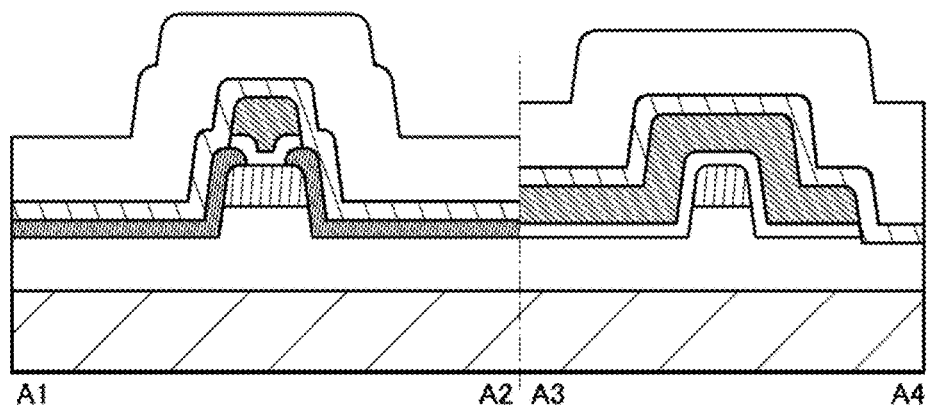

Although FIGS. 1A to 1C show an example where the conductor 404 which is a first gate electrode of the transistor is not electrically connected to the conductor 413 which is a second gate electrode, a transistor structure of one embodiment of the present invention is not limited thereto. For example, as illustrated in FIG. 3A, the conductor 404 may be electrically connected to the conductor 413. With such a structure, the conductor 404 and the conductor 413 are supplied with the same potential; thus, switching characteristics of the transistor can be improved. Alternatively, as illustrated in FIG. 3B, the conductor 413 may be omitted.

Figure 4A:
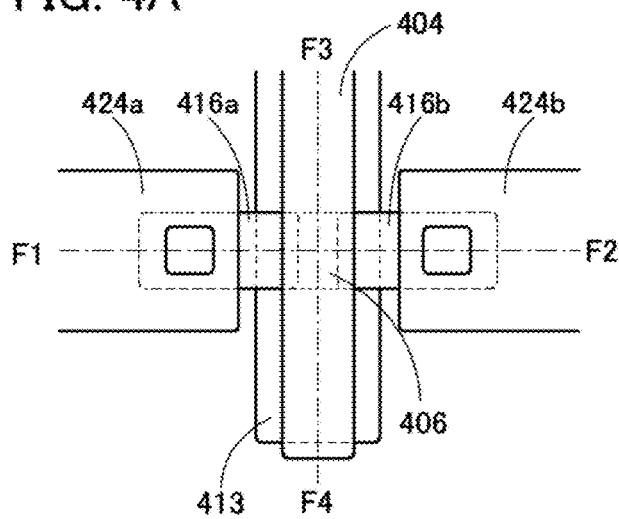
FIGS. 4A and 4B are a plan view and a cross-sectional view illustrating a transistor of one embodiment of the present invention.
Figure 4B:
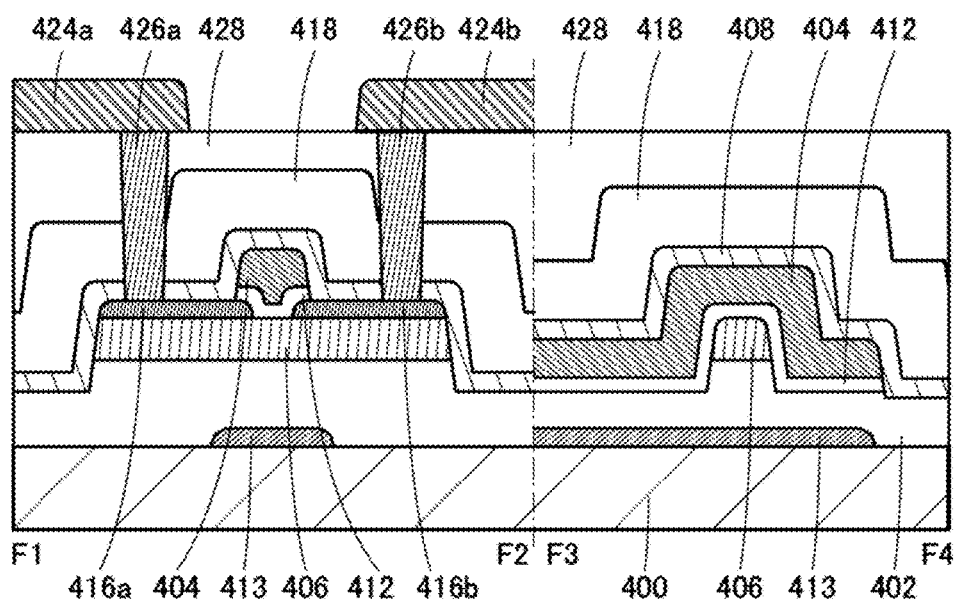

FIG. 4A is an example of a plan view of a transistor. FIG. 4B is an example of a cross-sectional view taken along dashed-dotted line F1-F2 and dashed-dotted line F3-F4 in FIG. 4A. Note that some components such as an insulator are omitted in FIG. 4A for easy understanding.

Although FIGS. 1A to 1C and the like show an example where the conductor 416a and the conductor 416b which function as a source electrode and a drain electrode are in contact with a top surface and a side surface of the semiconductor 406, a top surface of the insulator 402, and the like, a transistor structure of one embodiment of the present invention is not limited thereto. For example, as illustrated in FIGS. 4A and 4B, the conductor 416a and the conductor 416b may be in contact with only the top surface of the semiconductor 406.

As illustrated in FIG. 4B, an insulator 428 may be provided over the insulator 418. The insulator 428 preferably has a flat top surface. The insulator 428 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 428 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. To planarize the top surface of the insulator 428, planarization treatment may be performed by a chemical mechanical polishing (CMP) method or the like.

A resin may be used as the insulator 428. For example, a resin containing polyimide, polyamide, acrylic, silicone, or the like may be used. The use of a resin eliminates the need for planarization treatment performed on the top surface of the insulator 428 in some cases. By using a resin, a thick film can be formed in a short time; thus, the productivity can be increased.

As illustrated in FIGS. 4A and 4B, a conductor 424a and a conductor 424b may be provided over the insulator 428. The conductor 424a and the conductor 424b may function as wirings, for example. The insulator 428 may include an opening and the conductor 416a and the conductor 424a may be electrically connected to each other through the opening. The insulator 428 may have another opening and the conductor 416b and the conductor 424b may be electrically connected to each other through the opening. In this case, a conductor 426a and a conductor 426b may be provided in the respective openings.

Each of the conductors 424a and 424b may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

In the transistor illustrated in FIGS. 4A and 4B, the conductor 416a and the conductor 416b are not in contact with a side surface of the semiconductor 406. Thus, an electric field applied from the conductor 404 functioning as a first gate electrode to the side surface of the semiconductor 406 is less likely to be blocked by the conductors 416a and 416b and the like. The conductor 416a and the conductor 416b are not in contact with a top surface of the insulator 402. Thus, excess oxygen (oxygen) released from the insulator 402 is not consumed to oxidize the conductor 416a and the conductor 416b.

Accordingly, excess oxygen (oxygen) released from the insulator 402 can be efficiently used to reduce oxygen vacancies in the semiconductor 406. In other words, the transistor having the structure illustrated in FIGS. 4A and 4B has excellent electrical characteristics such as a high on-state current, high field-effect mobility, a small subthreshold swing value, and high reliability.

Figure 5A:
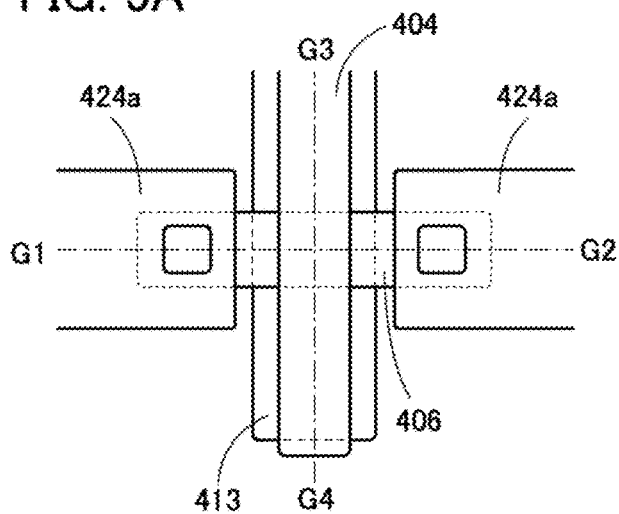
FIGS. 5A and 5B are a plan view and a cross-sectional view illustrating a transistor of one embodiment of the present invention.
Figure 5B:
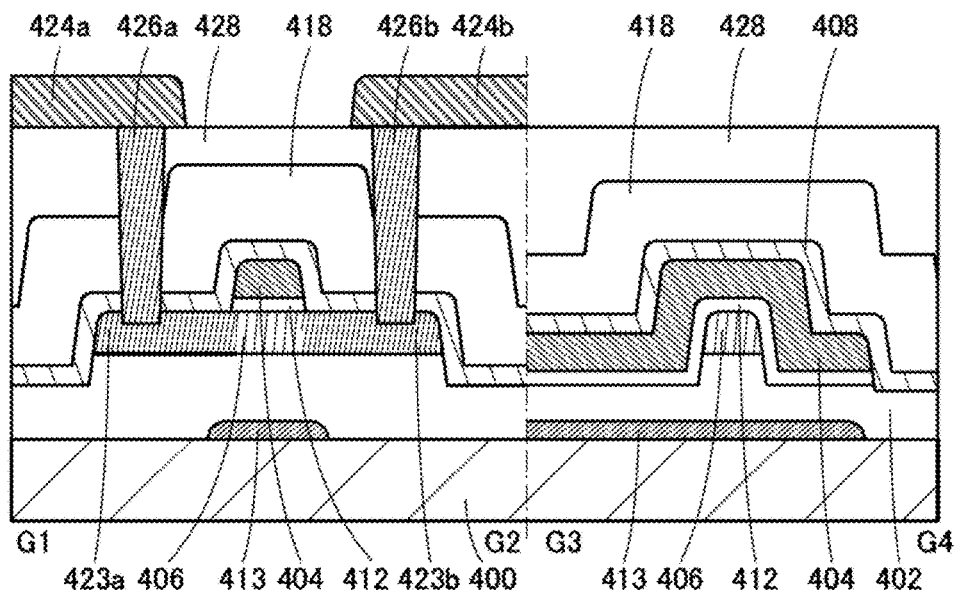

FIGS. 5A and 5B are a plan view and a cross-sectional view of a transistor of one embodiment of the present invention. FIG. 5A is a plan view and FIG. 5B is a cross-sectional view taken along dashed-dotted line G2-G2 and dashed-dotted line G3-G4 in FIG. 5A. Note that for simplification of the drawing, some components are not illustrated in the plan view in FIG. 5A.

The transistor may have a structure in which, as illustrated in FIGS. 5A and 5B, the conductor 416a and the conductor 416b are not provided and the conductor 426a and the conductor 426b are in contact with the semiconductor 406. In this case, a low-resistance region 423a (a low-resistance region 423b) is preferably provided in a region in contact with at least the conductor 426a and the conductor 426b in the semiconductor 406. The low-resistance region 423a and the low-resistance region 423b may be formed in such a manner that, for example, the conductor 404 and the like are used as masks and impurities are added to the semiconductor 406. The conductor 426a and the conductor 426b may be provided in holes (portions which penetrate) or recessed portions (portions which do not penetrate) of the semiconductor 406. When the conductor 426a and the conductor 426b are provided in holes or recessed portions of the semiconductor 406, contact areas between the conductors 426a and 426b and the semiconductor 406 are increased; thus, the adverse effect of the contact resistance can be decreased. In other words, the on-state current of the transistor can be increased.

Figure 6A:
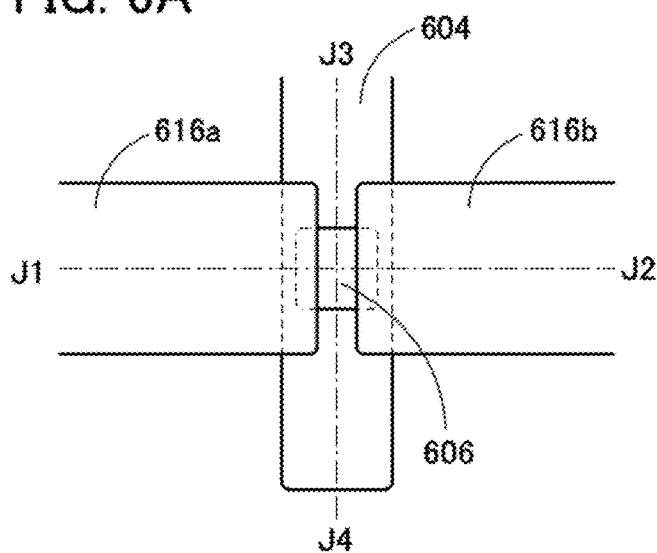
FIGS. 6A and 6B are a plan view and a cross-sectional view illustrating a transistor of one embodiment of the present invention.
Figure 6B:
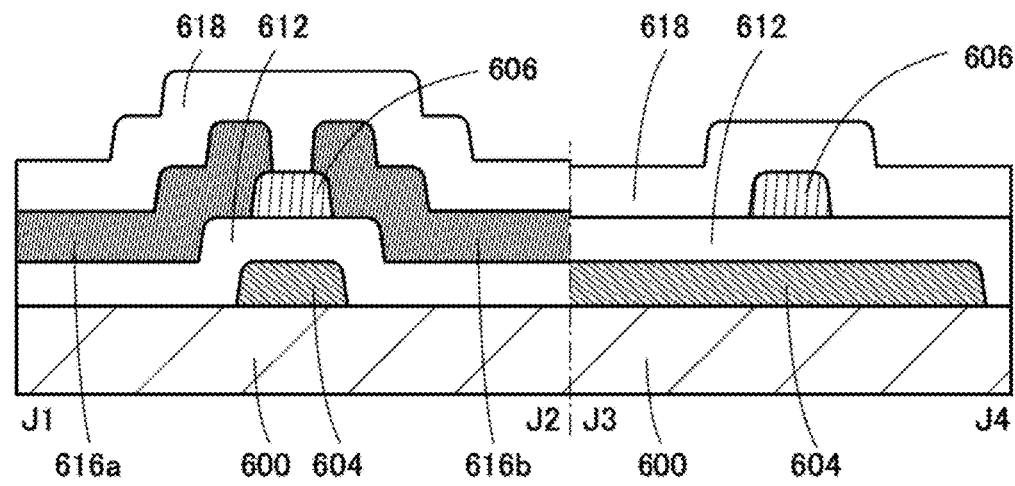

FIGS. 6A and 6B are a plan view and a cross-sectional view of a transistor of one embodiment of the present invention. FIG. 6A is a plan view and FIG. 6B is a cross-sectional view taken along dashed-dotted line J1-J2 and dashed-dotted line J3-J4 in FIG. 6A. Note that for simplification of the drawing, some components are not illustrated in the plan view in FIG. 6A.

The transistor in FIGS. 6A and 6B includes a conductor 604 over a substrate 600, an insulator 612 over the conductor 604, a semiconductor 606 over the insulator 612, a conductor 616a and a conductor 616b which are in contact with the semiconductor 606 and arranged to be apart from each other, and an insulator 618 over the semiconductor 606, the conductor 616a, and the conductor 616b. The conductor 604 faces a bottom surface of the semiconductor 606 with the insulator 612 provided therebetween. The insulator 612 may have a projection. An insulator may be provided between the substrate 600 and the conductor 604. For the insulator, the description of the insulator 402 or the insulator 408 is referred to. The insulator 618 is not necessarily provided.

The semiconductor 606 serves as a channel formation region of the transistor. The conductor 604 serves as a first gate electrode (also referred to as a front gate electrode) of the transistor. The conductor 616a and the conductor 616b serve as a source electrode and a drain electrode of the transistor.

The insulator 618 is preferably an insulator containing excess oxygen.

For the substrate 600, the description of the substrate 400 is referred to. For the conductor 604, the description of the conductor 404 is referred to. For the insulator 612, the description of the insulator 412 is referred to. For the semiconductor 606, the description of the semiconductor 406 is referred to. For the conductor 616a and the conductor 616b, the description of the conductor 416a and the conductor 416b is referred to. For the insulator 618, the description of the insulator 402 is referred to.

Over the insulator 618, a display element may be provided. For example, a pixel electrode, a liquid crystal layer, a common electrode, a light-emitting layer, an organic EL layer, an anode, a cathode, or the like may be provided. The display element is connected to the conductor 616a or the like, for example.

Figure 7A:
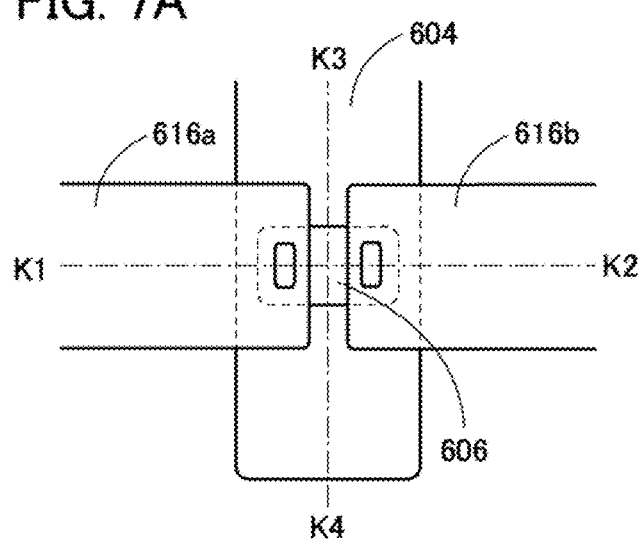
FIGS. 7A and 7B are a plan view and a cross-sectional view illustrating a transistor of one embodiment of the present invention.
Figure 7B:
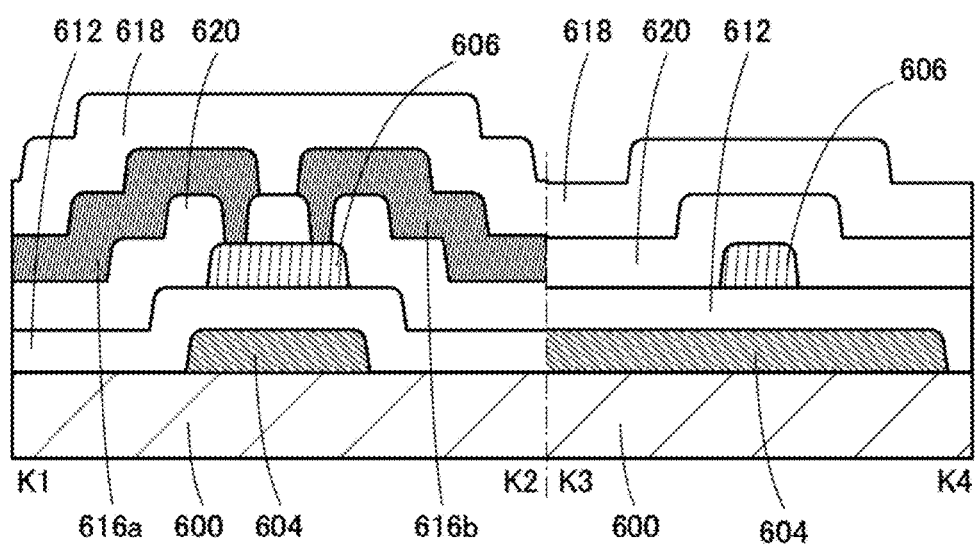

FIG. 7A is an example of a plan view of a transistor. FIG. 7B is an example of a cross-sectional view taken along dashed-dotted line K1-K2 and dashed-dotted line K3-K4 in FIG. 7A. Note that some components such as an insulator are omitted in FIG. 7A for easy understanding.

Over the semiconductor, an insulator that can function as a channel protective film may be provided. For example, as illustrated in FIGS. 7A and 7B, an insulator 620 may be provided between the semiconductor 606 and the conductors 616a and 616b. In that case, the conductor 616a (conductor 616b) and the semiconductor 606 are connected to each other through an opening in the insulator 620. For the insulator 620, the description of the insulator 618 may be referred to.

Figure 8A:
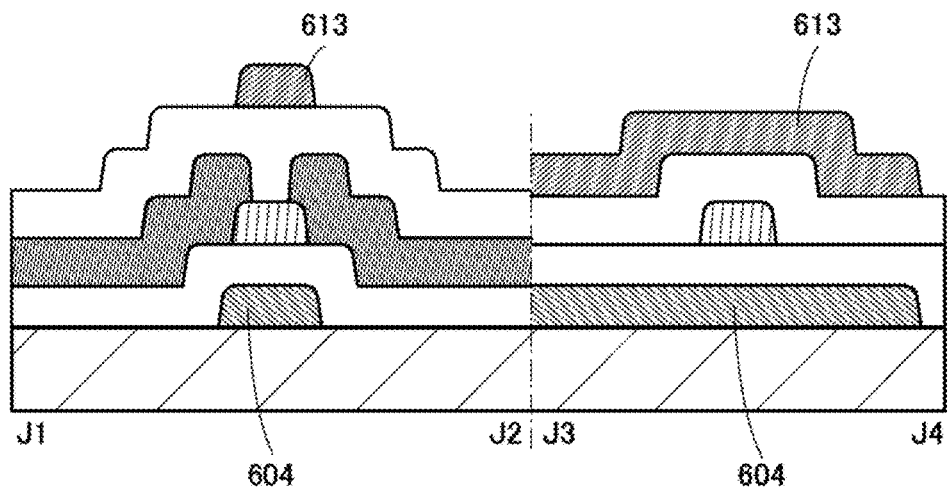
FIGS. 8A and 8B are cross-sectional views each illustrating a transistor of one embodiment of the present invention.
Figure 8B:
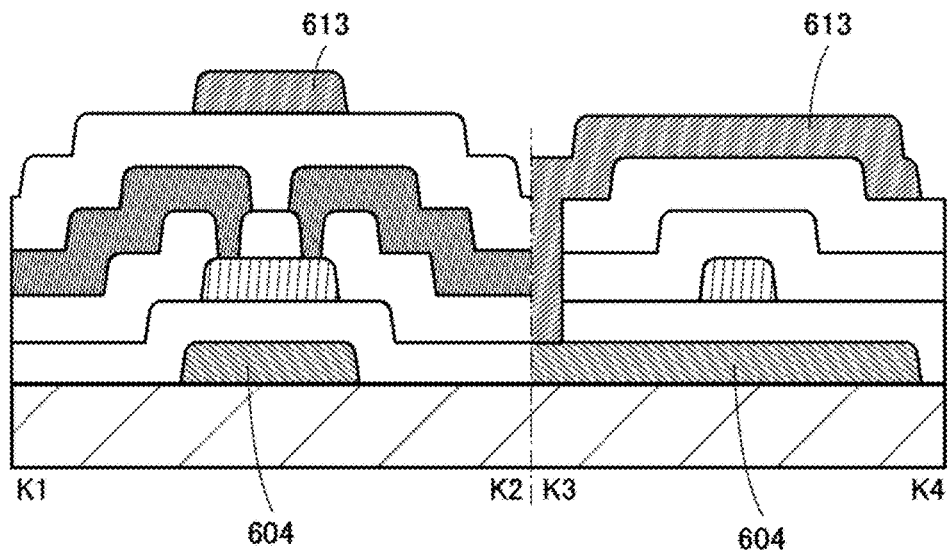

In FIG. 6B and FIG. 7B, a conductor 613 may be provided over the insulator 618. Examples in that case are shown in FIGS. 8A and 8B. For the conductor 613, the description of the conductor 413 is referred to. A potential or signal which is the same as that supplied to the conductor 604 or a potential or signal which is different from that supplied to the conductor 604 may be supplied to the conductor 613. For example, by supplying a constant potential to the conductor 613, the threshold voltage of a transistor may be controlled. In other words, the conductor 613 can function as a second gate electrode. Note that the transistor may have an s-channel structure using the conductor 613 or the like.

<Structure of Oxide Semiconductor>

A structure of an oxide semiconductor that can be used as the semiconductor 406, the semiconductor 606, and the like is described below.

An oxide semiconductor is classified into, for example, a non-single-crystal oxide semiconductor and a single crystal oxide semiconductor. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS is described.

A CAAC-OS is one of oxide semiconductors having a plurality of c-axis aligned crystal parts (also referred to as nanocrystal (nc)).

In a combined analysis image (also referred to as a high-resolution TEM image) of a bright-field image and a diffraction pattern of a CAAC-OS, which is obtained using a transmission electron microscope (TEM), a plurality of nanocrystals can be observed. However, in the high-resolution TEM image, a boundary between nanocrystals, that is, a grain boundary is not clearly observed. Thus, in the CAAC-OS, a reduction in electron mobility due to the grain boundary is less likely to occur.

Figure 9A:
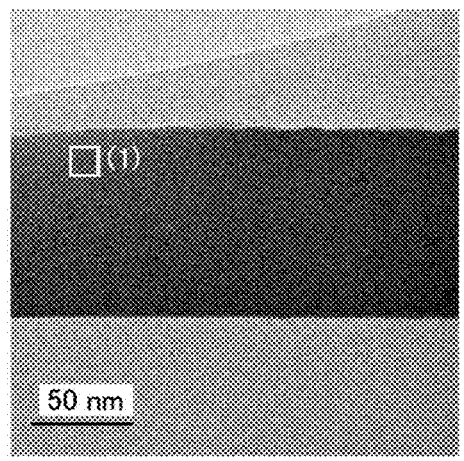
FIGS. 9A to 9C and FIG. 9D are Cs-corrected high-resolution TEM images of a cross section of a CAAC-OS and a cross-sectional schematic view of the CAAC-OS, respectively.

FIG. 9A shows an example of a high-resolution TEM image of a cross section of the CAAC-OS which is obtained from a direction substantially parallel to the sample surface. Here, the TEM image is obtained with a spherical aberration corrector function. The high-resolution TEM image obtained with a spherical aberration corrector function is particularly referred to as a Cs-corrected high-resolution TEM image in the following description. Note that the Cs-corrected high-resolution TEM image can be obtained with, for example, an atomic resolution analytical electron microscope JEM-ARM200F manufactured by JEOL Ltd.

Figure 9B:
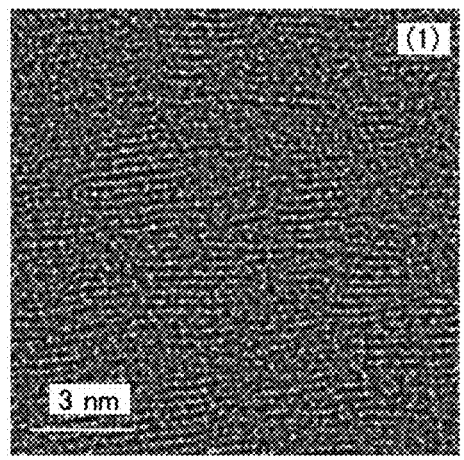

FIG. 9B is an enlarged Cs-corrected high-resolution TEM image of a region (1) in FIG. 9A. FIG. 9B shows that metal atoms are arranged in a layered manner in a nanocrystal. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 9C:
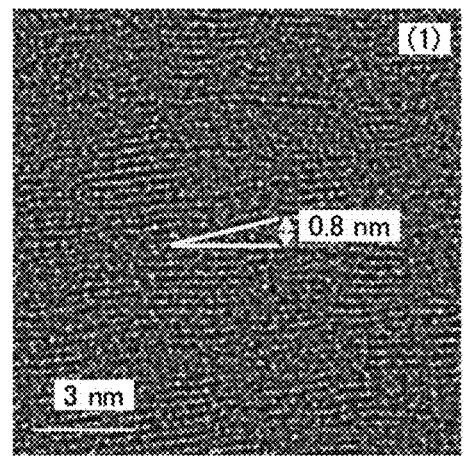

As shown in FIG. 9B, the CAAC-OS has a characteristic atomic arrangement. The characteristic atomic arrangement is denoted by an auxiliary line in FIG. 9C. FIGS. 9B and 9C prove that the size of a nanocrystal is approximately 1 nm to 3 nm, and the size of a space caused by tilt of the nanocrystals is approximately 0.8 nm.

Figure 9D:
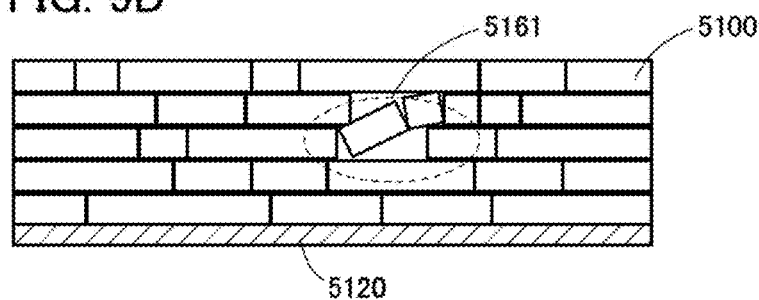

Here, according to the Cs-corrected high-resolution TEM images, the schematic arrangement of nanocrystals 5100 of a CAAC-OS over a substrate 5120 is illustrated by such a structure in which bricks or blocks are stacked (see FIG. 9D). The part in which the nanocrystals are tilted as observed in FIG. 9C corresponds to a region 5161 shown in FIG. 9D.

Figure 10A:
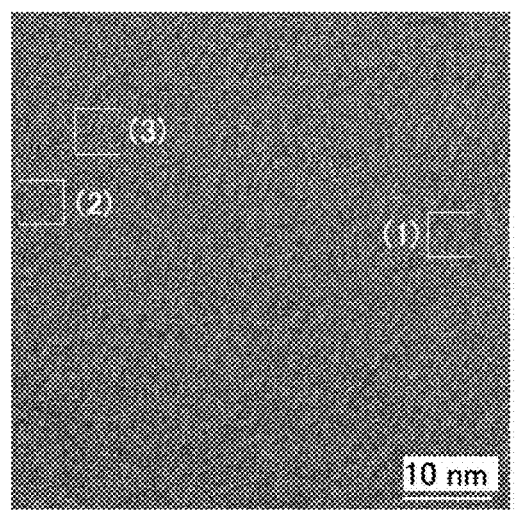
FIGS. 10A to 10D are Cs-corrected high-resolution TEM images of a plane of a CAAC-OS.
Figure 10B:
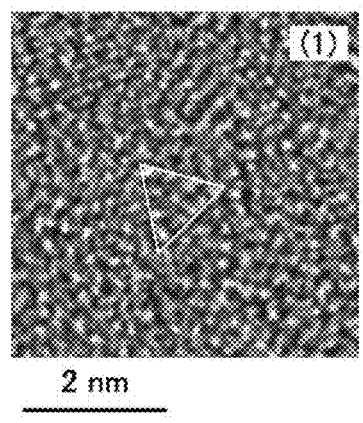
Figure 10C:
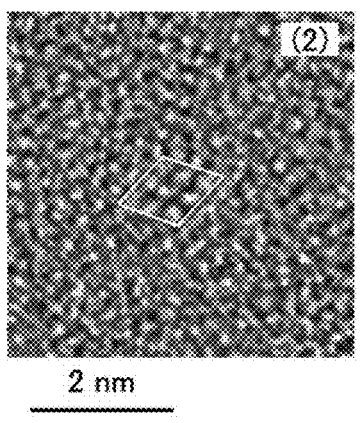
Figure 10D:
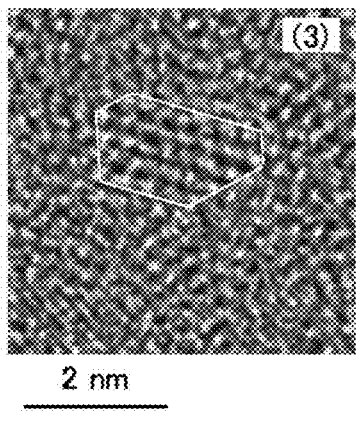

For example, as shown in FIG. 10A, a Cs-corrected high-resolution TEM image of a plane of the CAAC-OS obtained from a direction substantially perpendicular to the sample surface is observed. FIGS. 10B, 10C, and 10D are enlarged Cs-corrected high-resolution TEM images of regions (1), (2), and (3) in FIG. 10A, respectively. FIGS. 10B, 10C, and 10D indicate that metal atoms are arranged in a triangular, quadrangular, or hexagonal configuration in a nanocrystal. However, there is no regularity of arrangement of metal atoms between different nanocrystals.

Figure 11A:
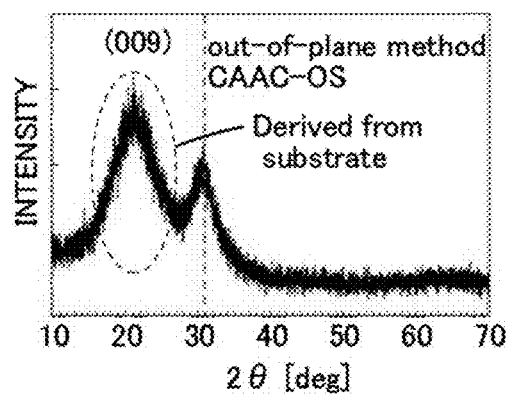
FIGS. 11A to 11C show structural analysis of a CAAC-OS and a single crystal oxide semiconductor by XRD.

For example, when the structure of a CAAC-OS including an $InGaZnO_4$ crystal is analyzed by an out-of-plane method using an X-ray diffraction (XRD) apparatus, a peak appears at a diffraction angle ($2\theta$) of around 31° as shown in FIG. 11A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS including an $InGaZnO_4$ crystal by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS, a peak appear when $2\theta$ is around 31° and that a peak not appear when $2\theta$ is around 36°.

Figure 11B:
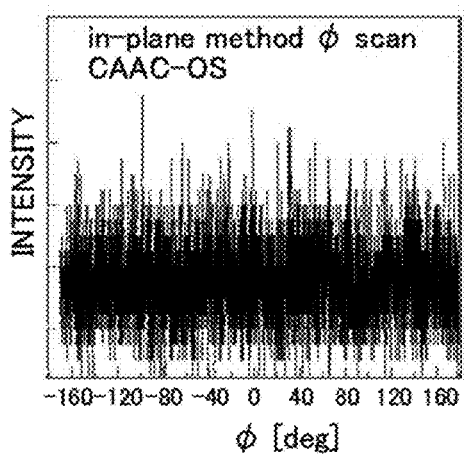
Figure 11C:
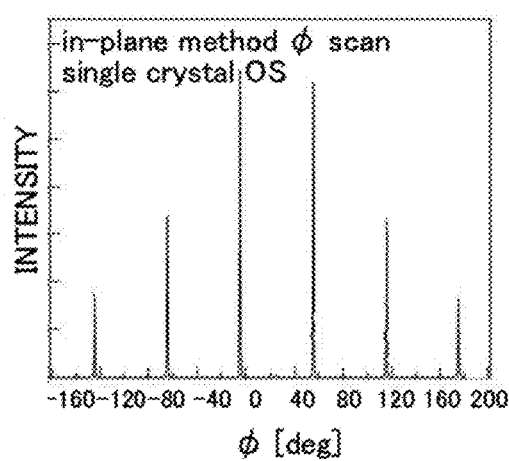

On the other hand, in structural analysis of the CAAC-OS by an in-plane method in which an X-ray is incident on a sample in a direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 11B, a peak is not clearly observed. In contrast, in the case of a single crystal oxide semiconductor of $InGaZnO_4$, when $\phi$ scan is performed with $2\theta$ fixed at around 56°, as shown in FIG. 11C, six peaks which are derived from crystal planes equivalent to the (110) plane are observed. Accordingly, the structural analysis using XRD shows that the directions of a-axes and b-axes are irregularly oriented in the CAAC-OS.

Figure 12A:
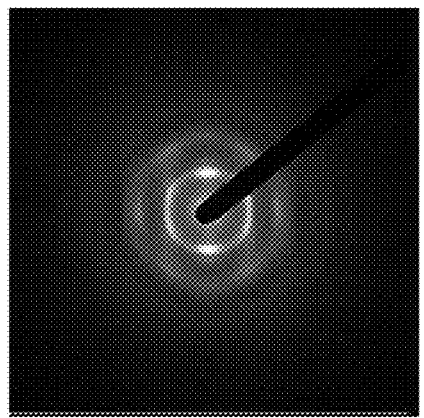
FIGS. 12A and 12B show electron diffraction patterns of a CAAC-OS.
Figure 12B:
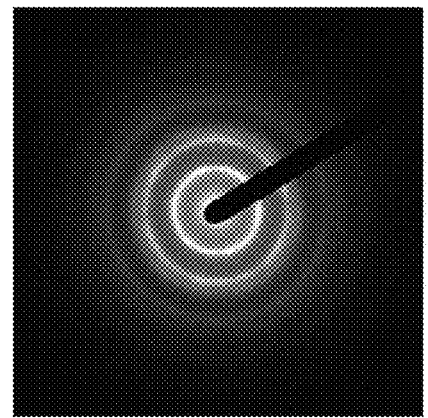

Next, FIG. 12A shows a diffraction pattern (also referred to as a selected-area transmission electron diffraction pattern) obtained in such a manner that an electron beam with a probe diameter of 300 nm is incident on an In—Ga—Zn oxide that is a CAAC-OS in a direction parallel to the sample surface. As shown in FIG. 12A, for example, spots derived from the (009) plane of an $InGaZnO_4$ crystal are observed. Thus, the electron diffraction also indicates that nanocrystals included in the CAAC-OS have c-axis alignment and that the c-axes are aligned in a direction substantially perpendicular to the formation surface or the top surface of the CAAC-OS. Meanwhile, FIG. 12B shows a diffraction pattern obtained in such a manner that an electron beam with a probe diameter of 300 nm is incident on the same sample in a direction perpendicular to the sample surface. As shown in FIG. 12B, a ring-like diffraction pattern is observed. Thus, the electron diffraction also indicates that the a-axes and b-axes of the nanocrystals included in the CAAC-OS do not have regular alignment. The first ring in FIG. 12B is considered to be derived from the (010) plane, the (100) plane, and the like of the $InGaZnO_4$ crystal. The second ring in FIG. 12B is considered to be derived from the (110) plane and the like.

Since the c-axes of the nanocrystals are aligned in a direction substantially perpendicular to the formation surface or the top surface in the above manner, the CAAC-OS can also be referred to as an oxide semiconductor including c-axis aligned nanocrystals (CANC).

The CAAC-OS is an oxide semiconductor with a low impurity concentration. The impurity means an element other than the main components of the oxide semiconductor, such as hydrogen, carbon, silicon, or a transition metal element. An element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity. Additionally, the impurity contained in the oxide semiconductor might serve as a carrier trap or a carrier generation source.

Moreover, the CAAC-OS is an oxide semiconductor having a low density of defect states. For example, oxygen vacancies in the oxide semiconductor serve as carrier traps or serve as carrier generation sources when hydrogen is captured therein.

In a transistor using the CAAC-OS, change in electrical characteristics due to irradiation with visible light or ultraviolet light is small.

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a nanocrystal in a CAAC-OS. Therefore, a crystal part of the nc-OS may be referred to as a nanocrystal in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a nanocrystal, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a nanocrystal (the electron diffraction is also referred to as selected-area electron diffraction). Meanwhile, spots appear in a nanobeam electron diffraction pattern of the nc-OS obtained by using an electron beam having a probe diameter close to or smaller than the size of a nanocrystal. Moreover, in a nanobeam electron diffraction pattern of the nc-OS, regions with high luminance in a circular (ring) pattern are shown in some cases. Also in a nanobeam electron diffraction pattern of the nc-OS, a plurality of spots are shown in a ring-like region in some cases.

Since there is no regularity of crystal orientation between the nanocrystals as mentioned above, the nc-OS can also be referred to as an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor.

Note that there is no regularity of crystal orientation between different nanocrystals in the nc-OS. Therefore, the nc-OS has a higher density of defect states than the CAAC-OS.

Next, an amorphous oxide semiconductor is described.

The amorphous oxide semiconductor is an oxide semiconductor having disordered atomic arrangement and no crystal part. An example of the amorphous oxide semiconductor is an oxide semiconductor with a non-crystalline state like quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

Note that an oxide semiconductor may have a structure having physical properties intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

A difference in effect of electron irradiation between structures of an oxide semiconductor is described below.

An a-like OS, an nc-OS, and a CAAC-OS are prepared. Each of the samples is an In—Ga—Zn oxide.

First, a high-resolution cross-sectional TEM image of each sample is obtained. The high-resolution cross-sectional TEM images show that all the samples have crystal parts.

Then, the size of the crystal part of each sample is measured. FIG. 13 shows the change in the average size of crystal parts (at 22 points to 45 points) in each sample. FIG. 13 indicates that the crystal part size in the a-like OS increases with an increase in the cumulative electron dose. Specifically, as shown by (1) in FIG. 13, a crystal part of approximately 1.2 nm at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$ regardless of the cumulative electron dose. Specifically, as shown by (2) in FIG. 13, the average crystal size is approximately 1.4 nm regardless of the observation time by TEM. Furthermore, as shown by (3) in FIG. 13, the average crystal size is approximately 2.1 nm regardless of the observation time by TEM.

In this manner, growth of the crystal part occurs due to the crystallization of the a-like OS, which is induced by a slight amount of electron beam employed in the TEM observation. In contrast, in the nc-OS and the CAAC-OS that have good quality, crystallization hardly occurs by a slight amount of electron beam used for TEM observation.

Note that the crystal part size in the a-like OS and the nc-OS can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Furthermore, the density of an oxide semiconductor varies depending on the structure in some cases. For example, when the composition of an oxide semiconductor is determined, the structure of the oxide semiconductor can be expected by comparing the density of the oxide semiconductor with the density of a single crystal oxide semiconductor having the same composition as the oxide semiconductor. For example, the density of the a-like OS is higher than or equal to 78.6% and lower than 92.3% of the density of the single crystal oxide semiconductor having the same composition. For example, the density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

Specific examples of the above description are given. For example, in the case of an oxide semiconductor having an atomic ratio of In:Ga:Zn=1:1:1, the density of single crystal $InGaZnO_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor may be a stacked film including two or more films of an amorphous oxide semiconductor, an a-like OS, a microcrystalline oxide semiconductor, and a CAAC-OS, for example.

An oxide semiconductor having a low impurity concentration and a low density of defect states (a small number of oxygen vacancies) can have low carrier density. Therefore, such an oxide semiconductor is referred to as a highly purified intrinsic or substantially highly purified intrinsic oxide semiconductor. A CAAC-OS and an nc-OS have a low impurity concentration and a low density of defect states as compared to an a-like OS and an amorphous oxide semiconductor. That is, a CAAC-OS and an nc-OS are likely to be highly purified intrinsic or substantially highly purified intrinsic oxide semiconductors. Thus, a transistor including a CAAC-OS or an nc-OS rarely has negative threshold voltage (is rarely normally on). The highly purified intrinsic or substantially highly purified intrinsic oxide semiconductor has few carrier traps. Therefore, a transistor including a CAAC-OS or an nc-OS has small variation in electrical characteristics and high reliability. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics.

<Semiconductor Device>

An example of a semiconductor device of one embodiment of the present invention is described below.

<Circuit>

An example of a circuit including a transistor of one embodiment of the present invention is described below.

<CMOS Inverter>

Figure 14A:
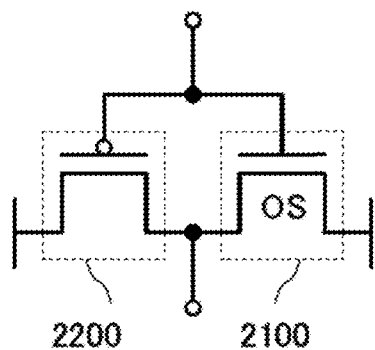
FIGS. 14A and 14B are circuit diagrams each illustrating a semiconductor device of one embodiment of the present invention.

A circuit diagram in FIG. 14A shows a configuration of a so-called CMOS inverter in which a p-channel transistor 2200 and an n-channel transistor 2100 are connected to each other in series and in which gates of them are connected to each other.

<Structure 1 of Semiconductor Device>

Figure 15:
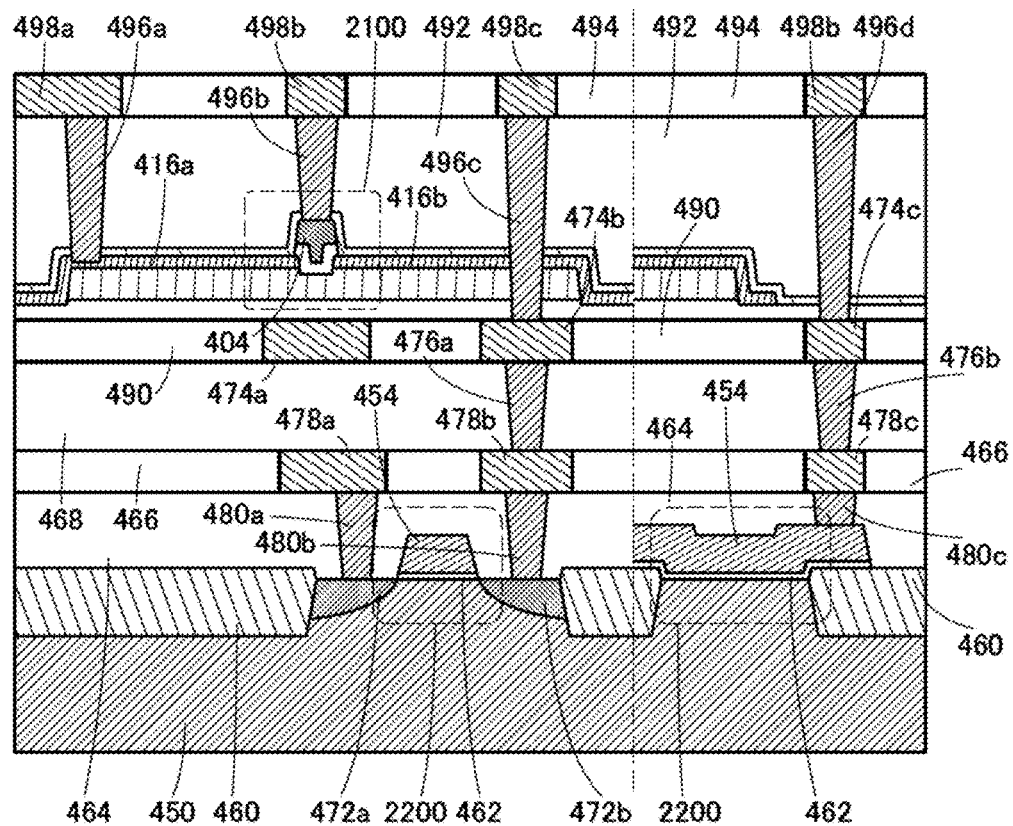
FIG. 15 is a cross-sectional view illustrating a semiconductor device of one embodiment of the present invention.

FIG. 15 is a cross-sectional view of the semiconductor device of FIG. 14A. The semiconductor device shown in FIG. 15 includes the transistor 2200 and the transistor 2100. The transistor 2100 is placed above the transistor 2200. Although an example where the transistor shown in FIGS. 1 to 1C is used as the transistor 2100 is shown, a semiconductor device of one embodiment of the present invention is not limited thereto. For example, the transistors illustrated in FIGS. 3A and 3B, FIGS. 4A and 4B, and FIGS. 5A and 5B can be used as the transistor 2100. Therefore, the description regarding the above-mentioned transistors is referred to for the transistor 2100 as appropriate.

The transistor 2200 shown in FIG. 15 is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the regions 472a and 472b have functions of a source region and a drain region. The insulator 462 has a function of a gate insulator. The conductor 454 has a function of a gate electrode. Therefore, the resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

A top surface of the semiconductor substrate 450 preferably has a (110) plane. Thus, on-state characteristics of the transistor 2200 can be improved.

The regions 472a and 472b are regions including impurities imparting the p-type conductivity. Accordingly, the transistor 2200 has a structure of a p-channel transistor.

Note that the transistor 2200 is separated from an adjacent transistor by a region 460 and the like. The region 460 is an insulating region.

The semiconductor device shown in FIG. 15 includes an insulator 464, an insulator 466, an insulator 468, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 490, an insulator 492, and an insulator 494.

The insulator 464 is placed over the transistor 2200. The insulator 466 is placed over the insulator 464. The insulator 468 is placed over the insulator 466. The insulator 490 is placed over the insulator 468. The transistor 2100 is placed over the insulator 490. The insulator 492 is placed over the transistor 2100. The insulator 494 is placed over the insulator 492.

The insulator 464 includes an opening reaching the region 472a, an opening reaching the region 472b, and an opening reaching the conductor 454. In the openings, the conductor 480a, the conductor 480b, and the conductor 480c are embedded.

In addition, the insulator 466 includes an opening reaching the conductor 480a, an opening reaching the conductor 480b, and an opening reaching the conductor 480c. In the openings, the conductor 478a, the conductor 478b, and the conductor 478c are embedded.

In addition, the insulator 468 includes an opening reaching the conductor 478b and an opening reaching the conductor 478c. In the openings, the conductor 476a and the conductor 476b are embedded.

In addition, the insulator 490 includes an opening overlapping with a channel formation region of the transistor 2100, an opening reaching the conductor 476a, and an opening reaching the conductor 476b. In the openings, the conductor 474a, the conductor 474b, and the conductor 474c are embedded.

The conductor 474a may have a function of a gate electrode of the transistor 2100. The electrical characteristics of the transistor 2100, such as the threshold voltage, may be controlled by application of a predetermined potential to the conductor 474a, for example. The conductor 474a may be electrically connected to the conductor 404 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable.

In addition, the insulator 492 includes an opening reaching the conductor 474b through the conductor 416b that is one of a source electrode and a drain electrode of the transistor 2100, an opening reaching the conductor 416a that is the other of the source electrode and the drain electrode of the transistor 2100, an opening reaching the conductor 404 that is the gate electrode of the transistor 2100, and an opening reaching the conductor 474c. In the openings, the conductor 496a, the conductor 496b, the conductor 496c, and the conductor 496d are embedded. Note that in some cases, the openings are provided through any of components of the transistor 2100 or the like.

In addition, the insulator 494 includes an opening reaching the conductor 496a, an opening reaching the conductor 496b and the conductor 496d, and an opening reaching the conductor 496c. In the openings, the conductor 498a, the conductor 498b, and the conductor 498c are embedded.

The insulators 464, 466, 468, 490, 492, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 401 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator that has a function of blocking oxygen and impurities such as hydrogen is preferably included in at least one of the insulators 464, 466, 468, 490, 492, and 494. When an insulator that has a function of blocking oxygen and impurities such as hydrogen is placed near the transistor 2100, the electrical characteristics of the transistor 2100 can be stable.

An insulator with a function of blocking oxygen and impurities such as hydrogen may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, and the conductor 498c may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 16:
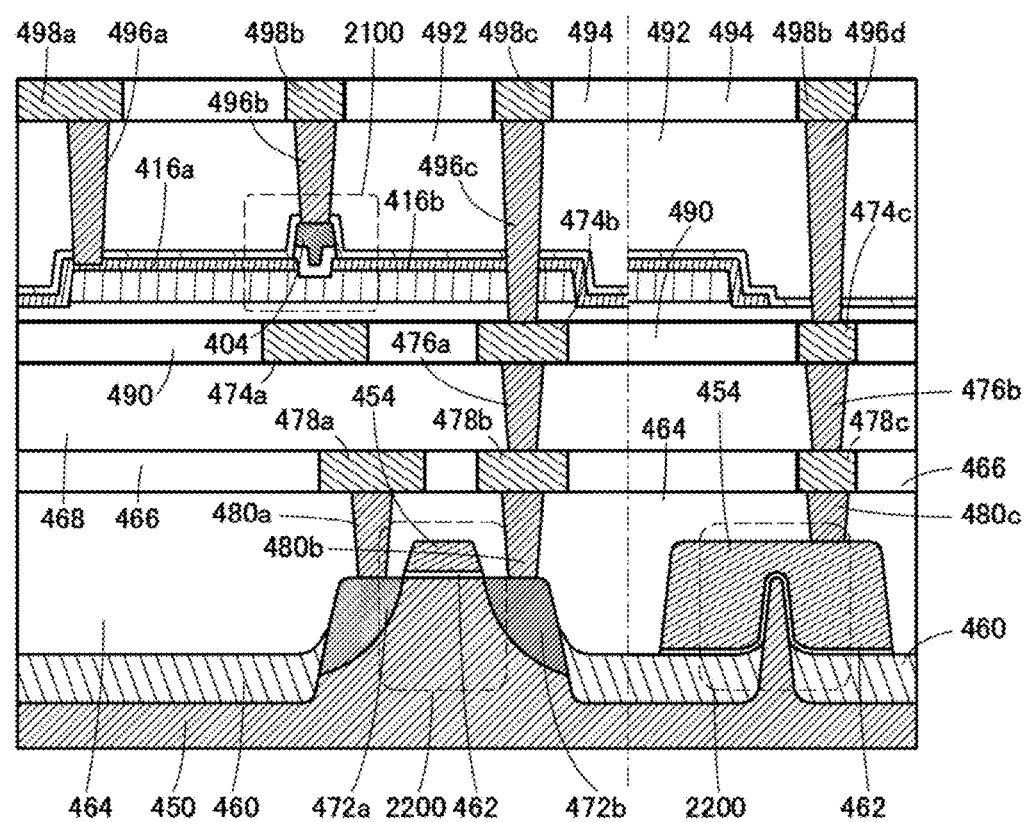
FIG. 16 is a cross-sectional view illustrating a semiconductor device of one embodiment of the present invention.

Note that a semiconductor device in FIG. 16 is the same as the semiconductor device in FIG. 15 except the structure of the transistor 2200. Therefore, the description of the semiconductor device in FIG. 15 is referred to for the semiconductor device in FIG. 16. In the semiconductor device in FIG. 16, the transistor 2200 is a FIN-type transistor. The effective channel width is increased in the FIN-type transistor 2200, whereby the on-state characteristics of the transistor 2200 can be improved. In addition, since contribution of the electric field of the gate electrode can be increased, the off-state characteristics of the transistor 2200 can be improved.

Figure 17:
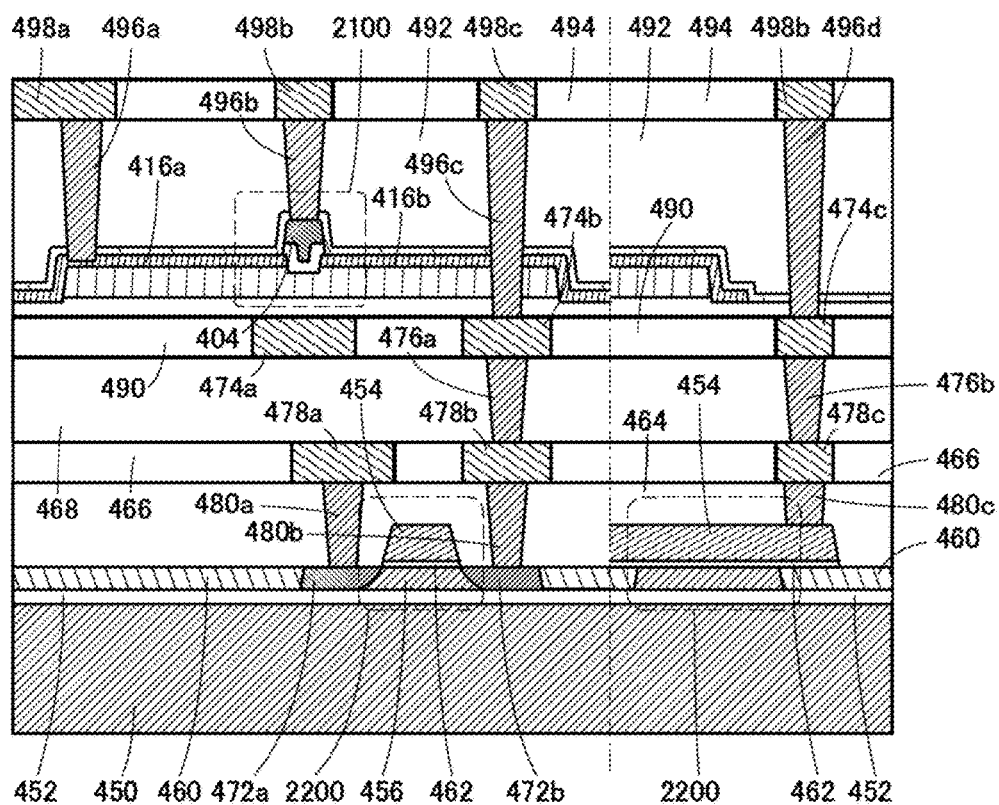
FIG. 17 is a cross-sectional view illustrating a semiconductor device of one embodiment of the present invention.

Note that a semiconductor device in FIG. 17 is the same as the semiconductor device in FIG. 15 except the structure of the transistor 2200. Therefore, the description of the semiconductor device in FIG. 15 is referred to for the semiconductor device in FIG. 17. In the semiconductor device in FIG. 17, the transistor 2200 is formed using an SOI substrate. In the structure in FIG. 17, a region 456 is separated from the semiconductor substrate 450 with an insulator 452 provided therebetween. Since the SOI substrate is used, a punch-through phenomenon and the like can be suppressed; thus, the off-state characteristics of the transistor 2200 can be improved. Note that the insulator 452 can be formed by turning part of the semiconductor substrate 450 into an insulator. For example, silicon oxide can be used as the insulator 452.

In each of the semiconductor devices shown in FIG. 15, FIG. 16, and FIG. 17, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or strain engineering can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 14B:
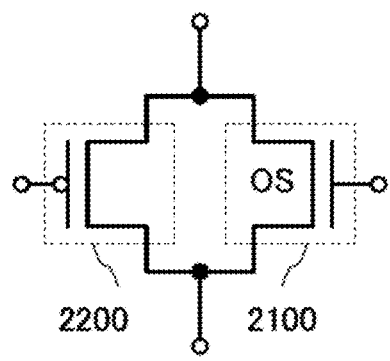

A circuit diagram in FIG. 14B shows a configuration in which sources of the transistors 2100 and 2200 are connected to each other and drains of the transistors 2100 and 2200 are connected to each other. With such a configuration, the transistors can function as a so-called CMOS analog switch.

<Memory Device 1>

Figure 18A:
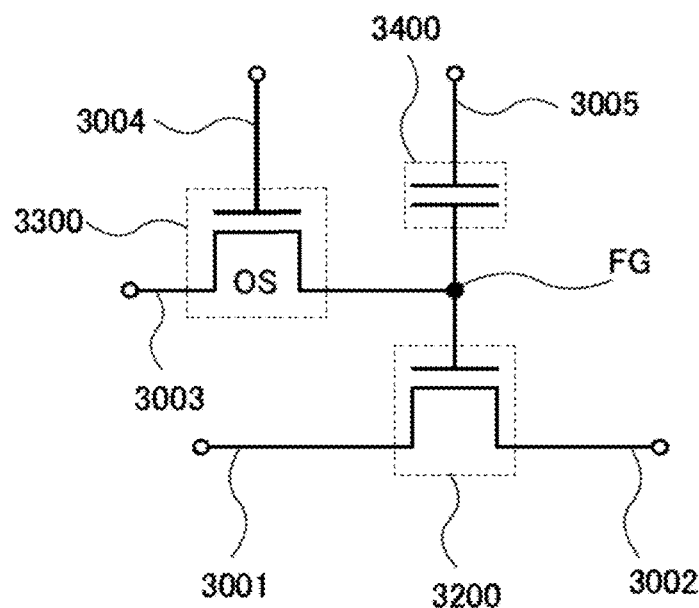
FIGS. 18A and 18B are circuit diagrams each illustrating a memory device of one embodiment of the present invention.
Figure 18B:
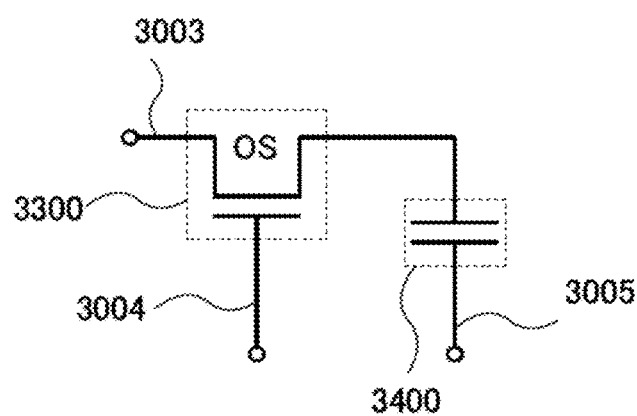

An example of a semiconductor device (memory device) which includes the transistor of one embodiment of the present invention, which can retain stored data even when not powered, and which has an unlimited number of write cycles is shown in FIGS. 18A and 18B.

The semiconductor device illustrated in FIG. 18A includes a transistor 3200 using a first semiconductor, a transistor 3300 using a second semiconductor, and a capacitor 3400. Note that any of the above-described transistors can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 18A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 18A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is off, so that the transistor 3300 is turned off. Thus, the charge is held at the node FG (retaining).

Since the off-state current of the transistor 3300 is low, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is brought into "on state." In the case where the low-level charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. In the case where data of the other memory cells is not read, the fifth wiring 3005 may be supplied with a potential at which the transistor 3200 is in "off state" regardless of the charge supplied to the node FG, that is, a potential lower than $V_{th\_H}$. Alternatively, the fifth wiring 3005 may be supplied with a potential at which the transistor 3200 is brought into "on state" regardless of the charge supplied to the node FG, that is, a potential higher than $V_{th\_L}$.

<Structure 2 of Semiconductor Device>

Figure 19:
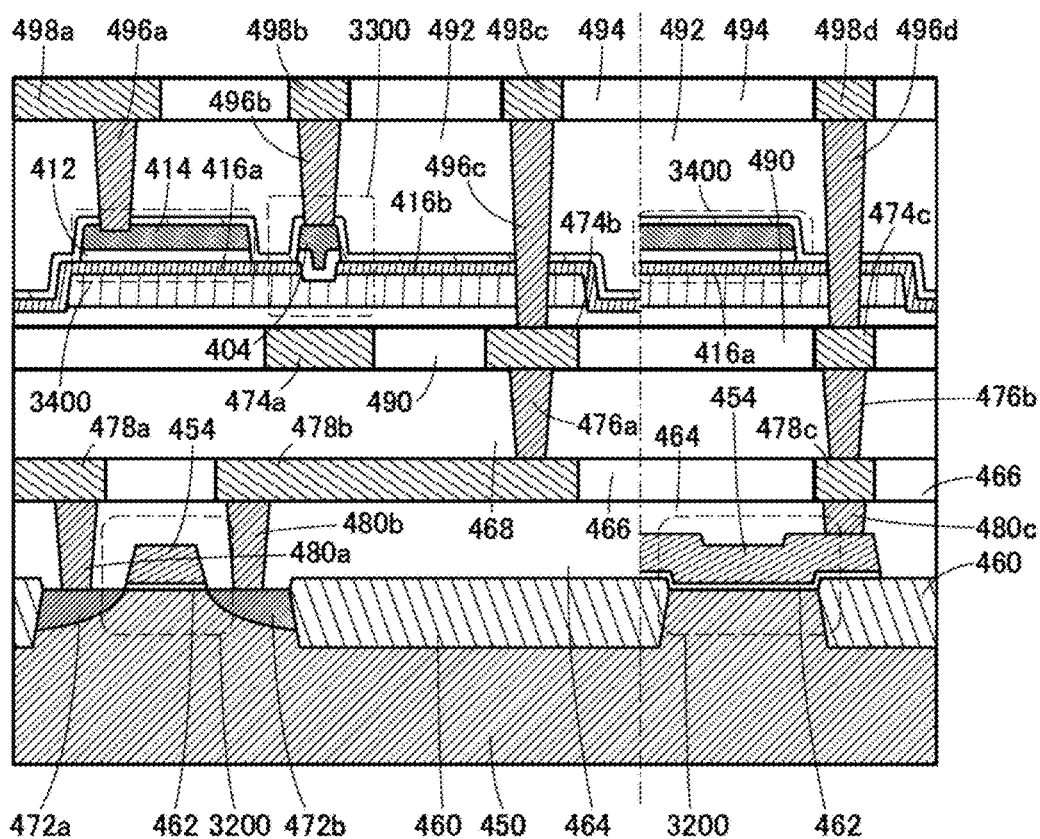
FIG. 19 is a cross-sectional view illustrating a semiconductor device of one embodiment of the present invention.

FIG. 19 is a cross-sectional view of the semiconductor device of FIG. 18A. The semiconductor device shown in FIG. 19 includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 2200 in FIG. 15 is referred to. Note that although the transistor 2200 is illustrated as a p-channel transistor in FIG. 15, the transistor 3200 may be an n-channel transistor.

The transistor 3200 illustrated in FIG. 19 is a transistor using a semiconductor substrate 450. The transistor 3200 includes a region 472a in the semiconductor substrate 450, a region 472b in the semiconductor substrate 450, an insulator 462, and a conductor 454.

The semiconductor device illustrated in FIG. 19 includes insulators 464, 466, and 468, conductors 480a, 480b, 480c, 478a, 478b, 478c, 476a, 476b, 474a, 474b, 474c, 496a, 496b, 496c, 496d, 498a, 498b, 498c, and 498d, and insulators 490, 492, and 494.

The insulator 464 is provided over the transistor 3200. The insulator 466 is provided over the insulator 464. The insulator 468 is provided over the insulator 466. The insulator 490 is provided over the insulator 468. The transistor 3300 is provided over the insulator 490. The insulator 492 is provided over the transistor 3300. The insulator 494 is provided over the insulator 492.

The insulator 464 has an opening reaching the region 472a, an opening reaching the region 472b, and an opening reaching the conductor 454. In the openings, the conductor 480a, the conductor 480b, and the conductor 480c are embedded.

In addition, the insulator 466 includes an opening reaching the conductor 480a, an opening reaching the conductor 480b, and an opening reaching the conductor 480c. In the openings, the conductor 478a, the conductor 478b, and the conductor 478c are embedded.

In addition, the insulator 468 includes an opening reaching the conductor 478b and an opening reaching the conductor 478c. In the openings, the conductor 476a and the conductor 476b are embedded.

Furthermore, the insulator 490 includes an opening overlapping with the channel formation region of the transistor 3300, an opening reaching the conductor 476a, and an opening reaching the conductor 476b. In the openings, the conductors 474a, the conductor 474b, and the conductor 474c are embedded.

The conductor 474a may have a function as a bottom gate electrode of the transistor 3300. Alternatively, for example, electric characteristics such as the threshold voltage of the transistor 3300 may be controlled by application of a constant potential to the conductor 474a. Further alternatively, for example, the conductor 474a and the conductor 404 that is the top gate electrode of the transistor 3300 may be electrically connected to each other. Thus, the on-state current of the transistor 3300 can be increased. A punch-through phenomenon can be suppressed; thus, stable electric characteristics in the saturation region of the transistor 3300 can be obtained.

The insulator 492 includes an opening reaching the conductor 474b through the conductor 416b that is one of a source electrode and a drain electrode of the transistor 3300, an opening reaching the conductor 414, an opening reaching the conductor 404 that is the gate electrode of the transistor 3300, and an opening reaching the conductor 474c through the conductor 416a that is the other of the source electrode and the drain electrode of the transistor 3300. In the openings, the conductor 496a, the conductor 496b, the conductor 496c, and the conductor 496d are embedded. Note that in some cases, an opening provided in a component of the transistor 3300 or the like is through other components.

The insulator 494 includes an opening reaching the conductor 496a, an opening reaching the conductors 496b, an opening reaching the conductor 496c, and an opening reaching the conductor 496d. In the openings, the conductors 498a 498b, 498c, and 498d are embedded.

At least one of the insulators 464, 466, 468, 490, 492, and 494 preferably has a function of blocking oxygen and impurities such as hydrogen. When an insulator that has a function of blocking oxygen and impurities such as hydrogen is placed near the transistor 3300, the electrical characteristics of the transistor 3300 can be stable.

The conductor 498d may be formed to have a single-layer structure or a stacked-layer structure including a conductor containing, for example, one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The source or drain of the transistor 3200 is electrically connected to one of a source electrode and a drain electrode of the transistor 3300 through the conductor 480b, the conductor 478b, the conductor 476a, the conductor 474b, and the conductor 496c. The conductor 454 that is the gate electrode of the transistor 3200 is electrically connected to the conductor 416a that is the other of the source electrode and the drain electrode of the transistor 3300 through the conductor 480c, the conductor 478c, the conductor 476b, the conductor 474c, and the conductor 496d.

The capacitor 3400 includes an electrode electrically connected to the other of the source electrode and the drain electrode of the transistor 3300, the conductor 414, and the insulator 412. Because the insulator 412 can be formed by the same step as a gate insulator of the transistor 3300, productivity can be increased. When a layer formed by the same step as a gate electrode of the transistor 3300 is used as the conductor 414, productivity can be increased.

For the structures of other components, the description of FIG. 15 and the like can be referred to as appropriate.

Figure 20:
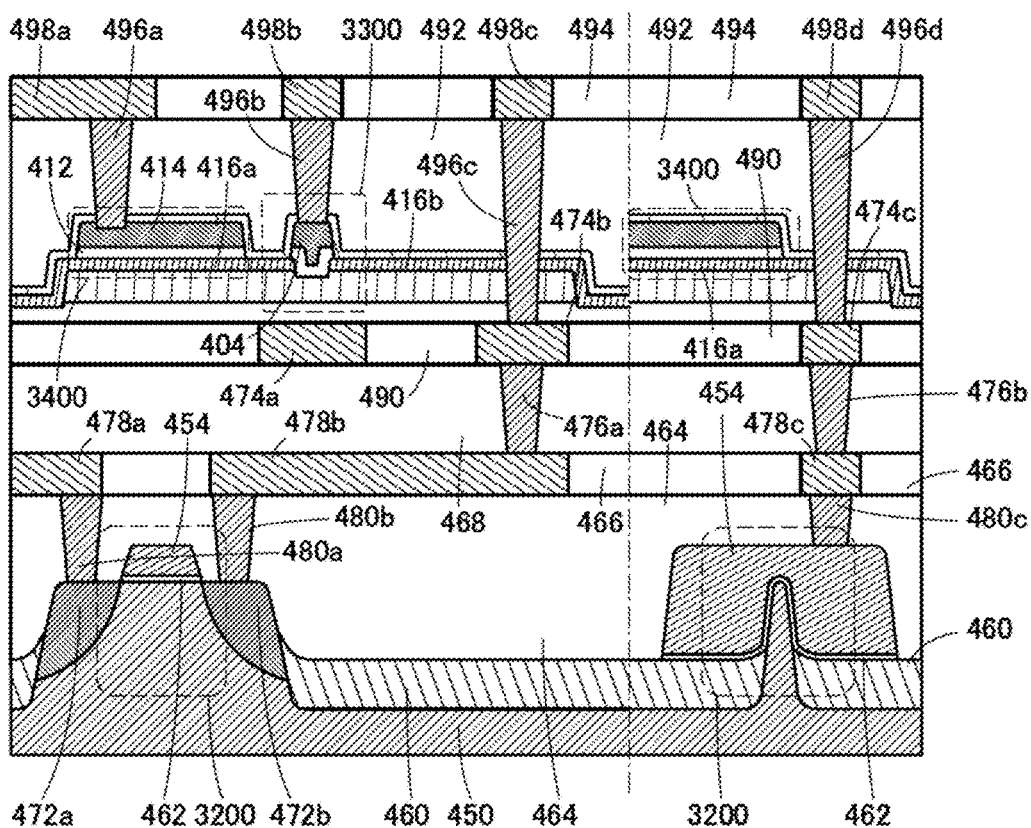
FIG. 20 is a cross-sectional view illustrating a semiconductor device of one embodiment of the present invention.

Note that a semiconductor device in FIG. 20 is the same as the semiconductor device in FIG. 19 except the structure of the transistor 3200. Therefore, the description of the semiconductor device in FIG. 19 is referred to for the semiconductor device in FIG. 20. Specifically, in the semiconductor device in FIG. 20, the transistor 3200 is a FIN-type transistor. For the FIN-type transistor 3200, the description of the transistor 2200 in FIG. 16 is referred to. Note that although the transistor 2200 is illustrated as a p-channel transistor in FIG. 16, the transistor 3200 may be an n-channel transistor.

Figure 21:
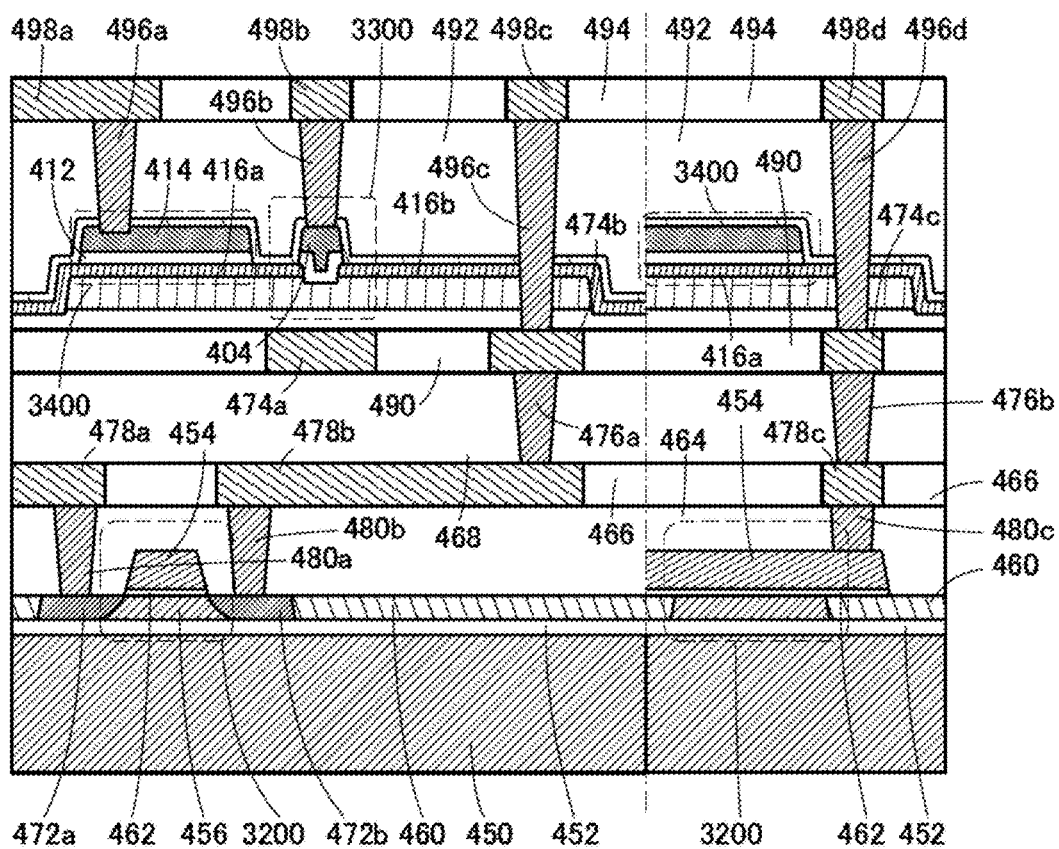
FIG. 21 is a cross-sectional view illustrating a semiconductor device of one embodiment of the present invention.

A semiconductor device in FIG. 21 is the same as the semiconductor device in FIG. 19 except a structure of the transistor 3200. Therefore, the description of the semiconductor device in FIG. 19 is referred to for the semiconductor device in FIG. 21. Specifically, in the semiconductor device in FIG. 21, the transistor 3200 is provided in the semiconductor substrate 450 that is an SOI substrate. For the transistor 3200, which is provided in the semiconductor substrate 450 that is an SOI substrate, the description of the transistor 2200 in FIG. 17 is referred to. Note that although the transistor 2200 is illustrated as a p-channel transistor in FIG. 17, the transistor 3200 may be an n-channel transistor.

<Memory Device 2>

The semiconductor device in FIG. 18B is different from the semiconductor device in FIG. 18A in that the transistor 3200 is not provided. Also in this case, data can be written and retained in a manner similar to that of the semiconductor device in FIG. 18A.

Reading of data in the semiconductor device in FIG. 18B is described. When the transistor 3300 is brought into on state, the third wiring 3003 which is in a floating state and the capacitor 3400 are brought into conduction, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0}+C \times V)/(C_B+C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0}+C \times V_1)/(C_B+C)$) is higher than the potential of the third wiring 3003 in the case of retaining the potential $V_0$ ($=(C_B \times VB_0 C \times V_0)/(C_B+C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Imaging Device>

An imaging device of one embodiment of the present invention is described below.

Figure 22A:
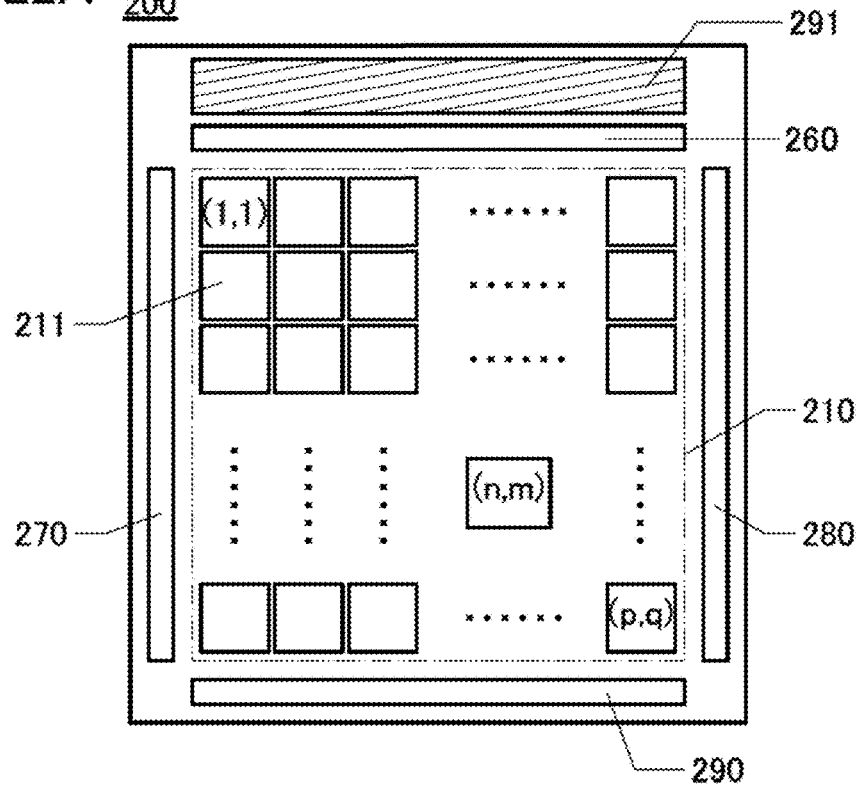
FIGS. 22A and 22B are plan views each illustrating a semiconductor device of one embodiment of the present invention.

FIG. 22A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each a natural number greater than or equal to 2). The peripheral circuit 260, the peripheral circuit 270, the peripheral circuit 280, and the peripheral circuit 290 are each connected to a plurality of pixels 211, and a signal for driving the plurality of pixels 211 is supplied. In this specification and the like, in some cases, "a peripheral circuit" or "a driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be provided over a substrate where the pixel portion 210 is formed. Part or the whole of the peripheral circuit may be mounted using a semiconductor device such as an IC. Note that as the peripheral circuit, one or more of the peripheral circuits 260, 270, 280, and 290 may be omitted.

Figure 22B:
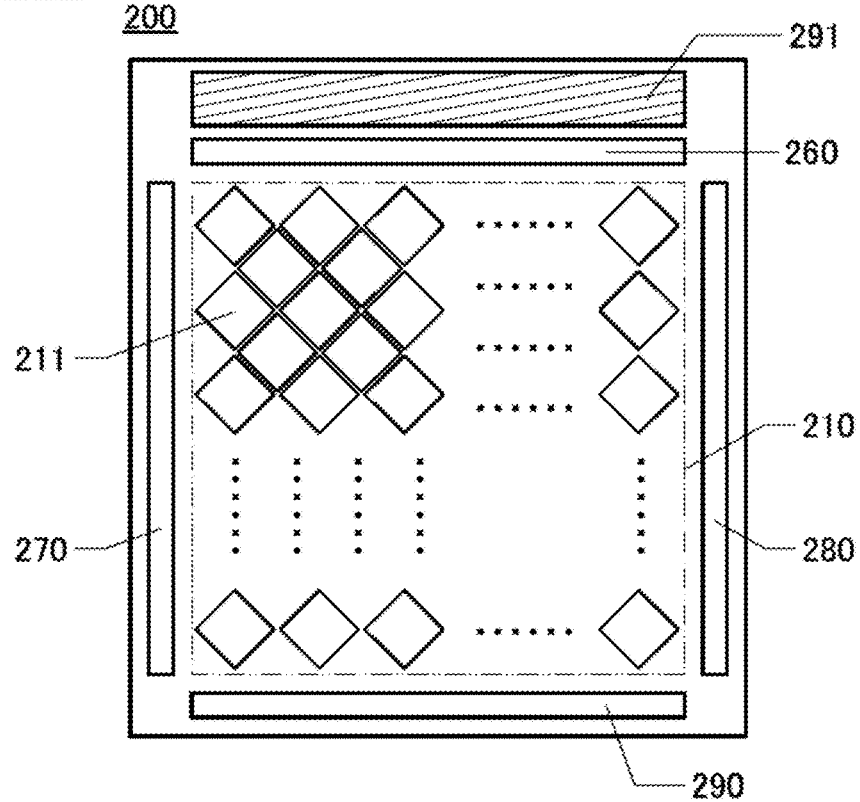

As illustrated in FIG. 22B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter which transmits light with a specific wavelength band (color filter), whereby data for achieving color image display can be obtained.

Figure 23A:
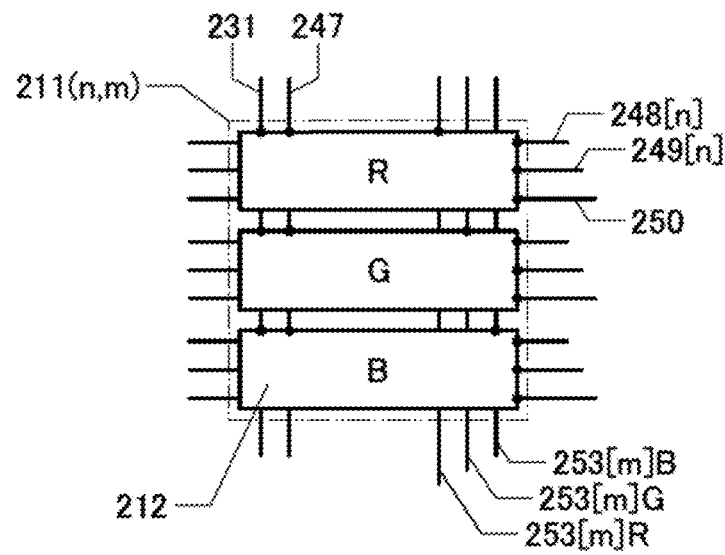
FIGS. 23A and 23B are block diagrams illustrating a semiconductor device of one embodiment of the present invention.

FIG. 23A is a plan view showing an example of the pixel 211 with which a color image is obtained. The pixel 211 illustrated in FIG. 23A includes a subpixel 212 provided with a color filter transmitting light with a red (R) wavelength band (also referred to "subpixel 212R"), a subpixel 212 provided with a color filter transmitting light with a green (G) wavelength band (also referred to "subpixel 212G"), and a subpixel 212 provided with a color filter transmitting light with a blue (B) wavelength band (also referred to "subpixel 212B"). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independent from one another. In this specification and the like, for example, the wiring 248 and the wiring 249 that are connected to the pixel 211 in the n-th row are referred to as a wiring 248[n] and a wiring 249[n]. For example, the wiring 253 connected to the pixel 211 in the m-th column is referred to as a wiring 253[m]. Note that in FIG. 23A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 23B:
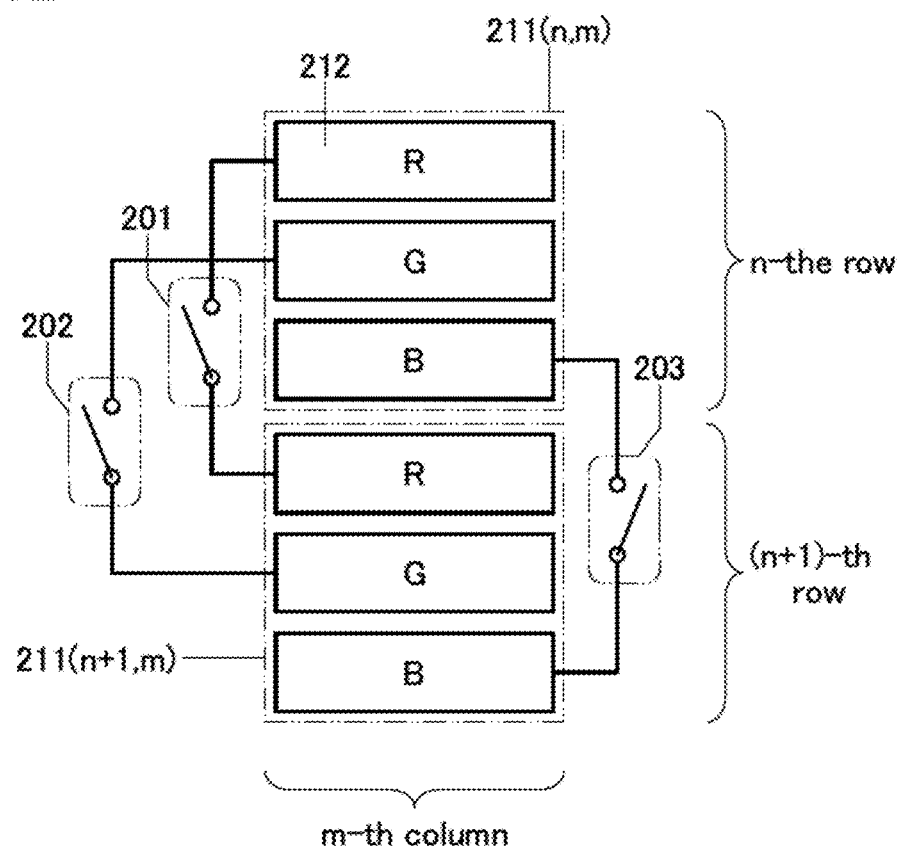

The imaging device 200 has a structure in which the subpixel 212 is electrically connected to the subpixel 212 in an adjacent pixel 211 which is provided with a color filter transmitting light with the same wavelength band as the subpixel 212, via a switch. FIG. 23B shows a connection example of the subpixels 212: the subpixel 212 in the pixel 211 arranged in an n-th (n is an integer greater than or equal to 1 and less than or equal to p) row and an m-th (m is an integer greater than or equal to 1 and less than or equal to q) column and the subpixel 212 in the adjacent pixel 211 arranged in an (n+1)-th row and the m-th column. In FIG. 23B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light with four different wavelength bands are provided in one pixel 211, the reproducibility of colors of an obtained image can be increased.

For example, in FIG. 23A, in regard to the subpixel 212 sensing a red wavelength band, the subpixel 212 sensing a green wavelength band, and the subpixel 212 sensing a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 24A and 24B. With the lens 255, the photoelectric conversion element can receive incident light efficiently. Specifically, as illustrated in FIG. 24A, light 256 enters a photoelectric conversion element 220 through the lens 255, the filter 254 (a filter 254R, a filter 254G, and a filter 254B), a pixel circuit 230, and the like which are provided in the pixel 211.

As indicated by a region surrounded with two-dotted chain lines; however, part of the light 256 indicated by arrows might be blocked by some wirings 257. Thus, a preferable structure is that the lens 255 and the filter 254 are provided on the photoelectric conversion element 220 side, so that the photoelectric conversion element 220 can efficiently receive the light 256 as illustrated in FIG. 24B. When the light 256 enters the photoelectric conversion element 220 from the photoelectric conversion element 220 side, the imaging device 200 with high sensitivity can be provided.

Figure 24A:
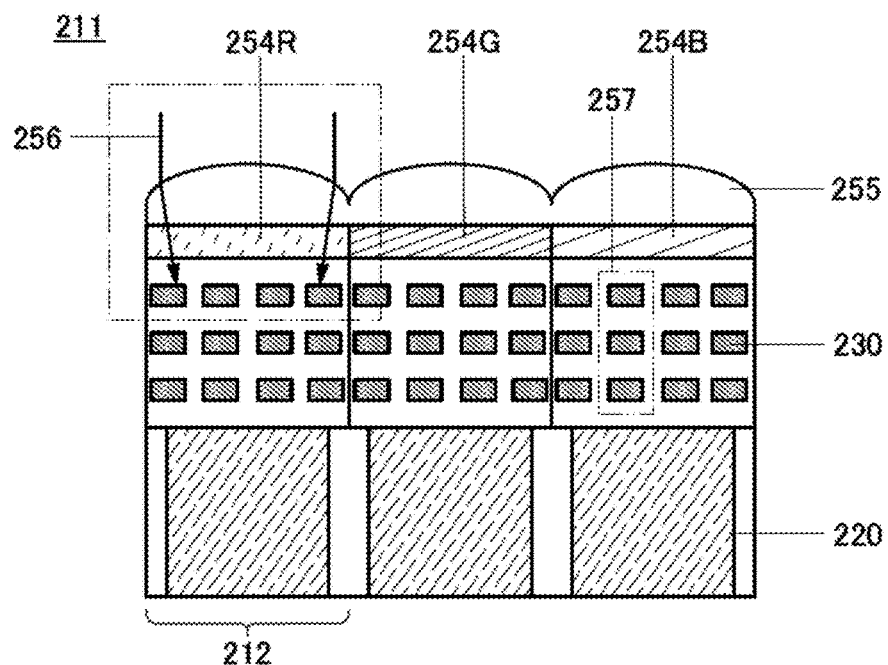
FIGS. 24A and 24B are cross-sectional views each illustrating a semiconductor device of one embodiment of the present invention.
Figure 24B:
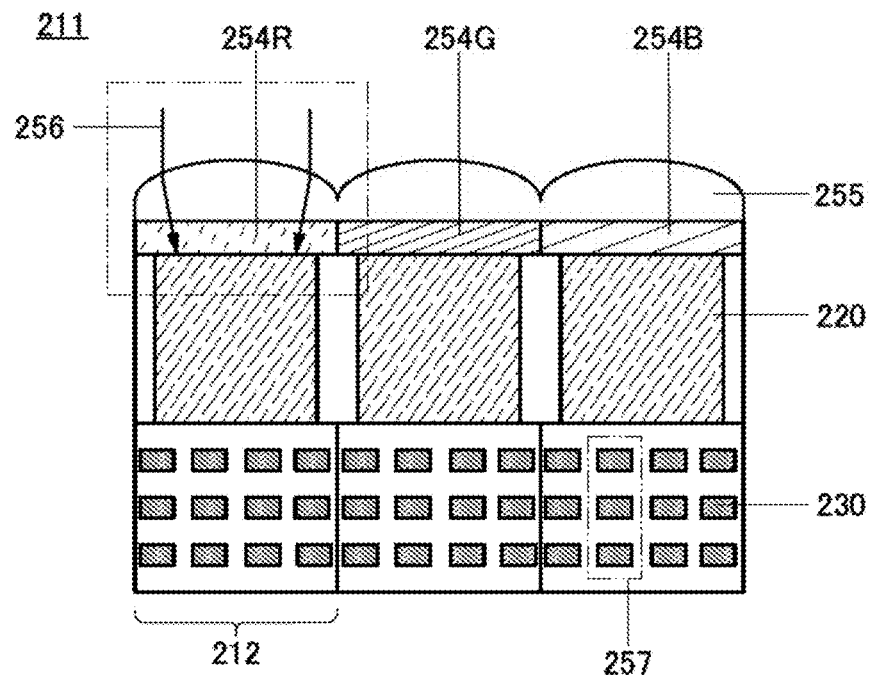

As the photoelectric conversion element 220 illustrated in FIGS. 24A and 24B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodine, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 23A and 23B.

<Configuration Example 2 of Pixel>

An example of a pixel including a transistor using silicon and a transistor using an oxide semiconductor is described below.

Figure 25A:
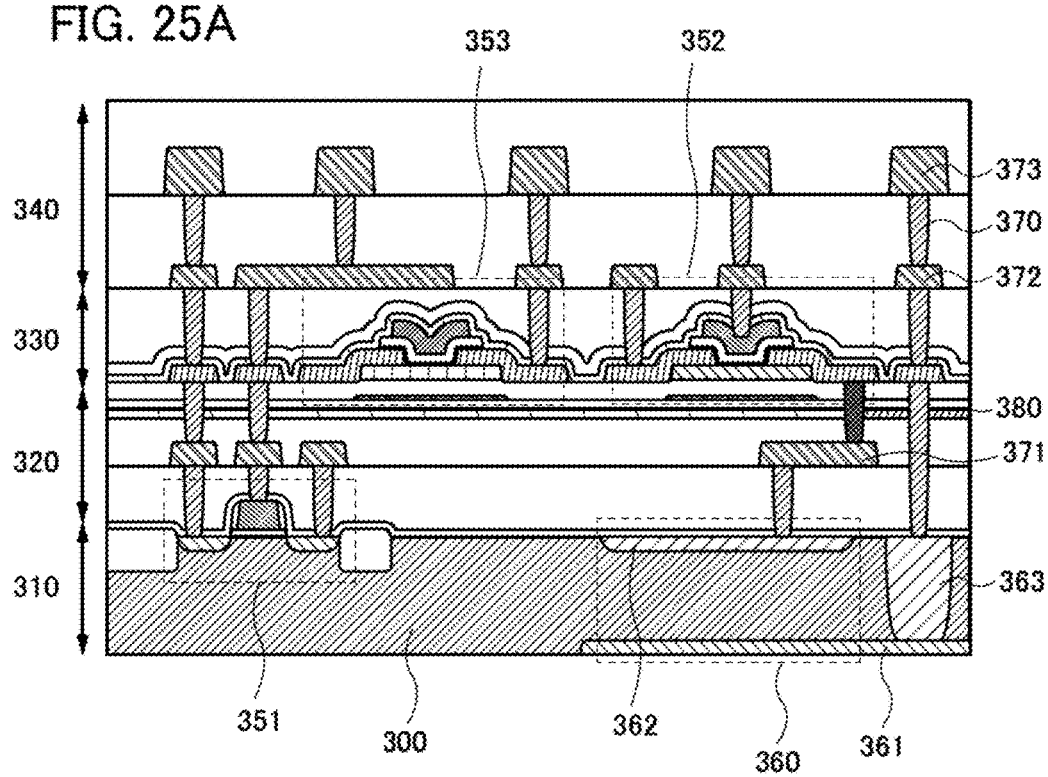
FIGS. 25A and 25B are cross-sectional views each illustrating a semiconductor device of one embodiment of the present invention.
Figure 25B:
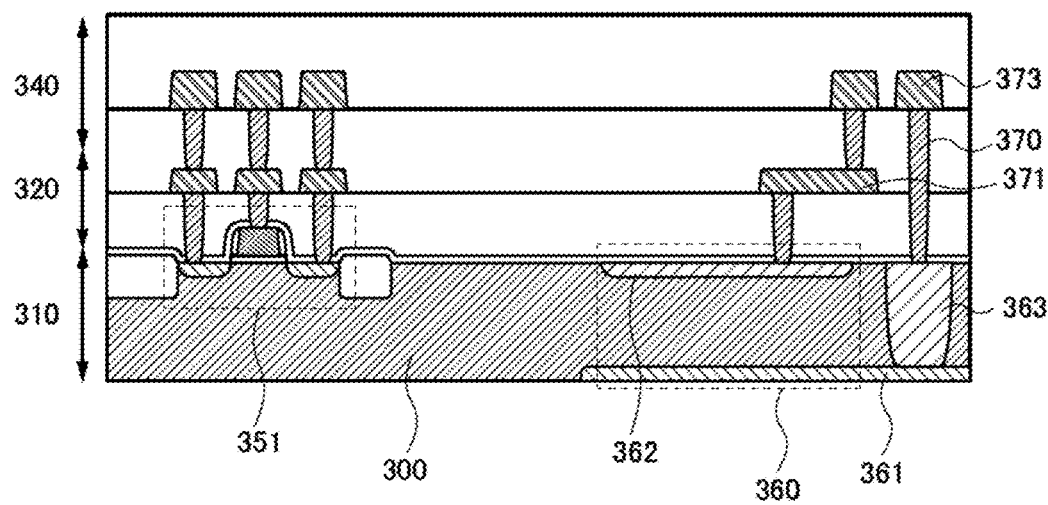

FIGS. 25A and 25B are each a cross-sectional view of an element included in an imaging device. The imaging device illustrated in FIG. 25A includes a transistor 351 including silicon over a silicon substrate 300, transistors 352 and 353 which include an oxide semiconductor and are stacked over the transistor 351, and a photodiode 360 provided in a silicon substrate 300. The transistors and the photodiode 360 are electrically connected to various plugs 370 and wirings 371. In addition, the photodiode 360 comprises an anode 361 and a cathode 362, and the anode 361 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of cross-sectional view in FIG. 25A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case of forming a pixel with use of transistors, the layer 310 may include the transistor. Alternatively, the layer 310 may be omitted, and the pixel may include only transistors.

In the case of forming a pixel with use of transistors, the layer 330 may be omitted. An example of a cross-sectional view in which the layer 330 is not provided is shown in FIG. 25B. In the case where the layer 330 is not provided, the wiring 372 of the layer 340 can be omitted.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 352, the transistor 353, and the like can be increased.

For the insulator 380, the description of the insulator 408 is referred to, for example.

In the cross-sectional view in FIG. 25A, the photodiode 360 in the layer 310 and the transistor in the layer 330 can be formed so as to overlap with each other. Thus, the degree of integration of pixels can be increased. In other words, the resolution of the imaging device can be increased.

As illustrated in FIG. 26A1 and FIG. 26B1, part or the whole of the imaging device can be bent. FIG. 26A1 illustrates a state in which the imaging device is bent in the direction of two-dotted chain line X1-X2. FIG. 26A2 is a cross-sectional view illustrating a portion indicated by two-dotted chain line X1-X2 in FIG. 26A1. FIG. 26A3 is a cross-sectional view illustrating a portion indicated by two-dotted chain line Y1-Y2 in FIG. 26A1.

FIG. 26B1 illustrates a state where the imaging device is bent in the direction of two-dotted chain line X3-X4 and the direction of two-dotted chain line Y3-Y4. FIG. 26B2 is a cross-sectional view illustrating a portion indicated by two-dotted chain line X3-X4 in FIG. 26B1. FIG. 26B3 is a cross-sectional view illustrating a portion indicated by two-dotted chain line Y3-Y4 in FIG. 26B1.

The bent imaging device enables the curvature of field and astigmatism to be reduced. Thus, the optical design of lens and the like, which is used in combination of the imaging device, can be facilitated. For example, the number of lens used for aberration correction can be reduced; accordingly, a reduction of size or weight of electronic devices using the imaging device, and the like, can be achieved. In addition, the quality of a captured image can be improved.

<CPU>

A CPU including a semiconductor device such as any of the above-described transistors or the above-described memory device is described below.

Figure 27:
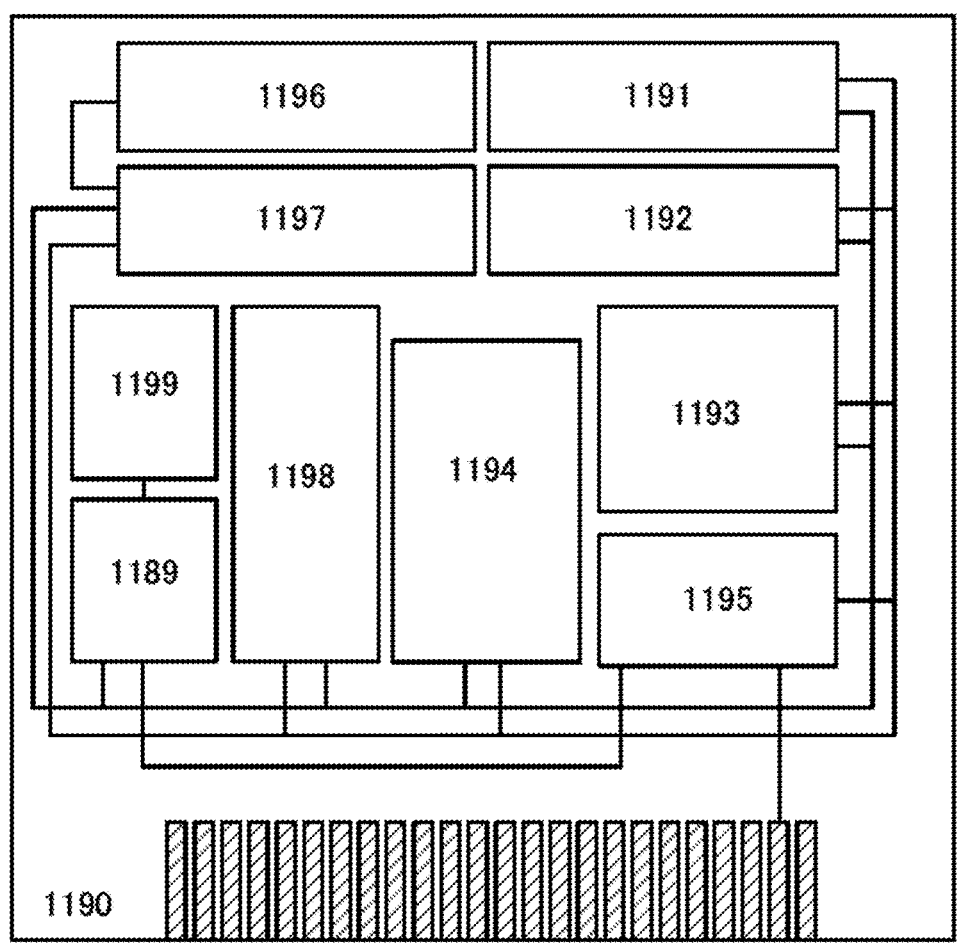
FIG. 27 is a block diagram illustrating a semiconductor device of one embodiment of the present invention.

FIG. 27 is a block diagram illustrating a configuration example of a CPU including any of the above-described transistors as a component.

The CPU illustrated in FIG. 27 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 27 is just an example in which the configuration has been simplified, and an actual CPU may have a variety of configurations depending on the application. For example, the CPU may have the following configuration: a structure including the CPU illustrated in FIG. 27 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 27, a memory cell is provided in the register 1196. For the memory cell of the register 1196, any of the above-described transistors, the above-described memory device, or the like can be used.

In the CPU illustrated in FIG. 27, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 28:
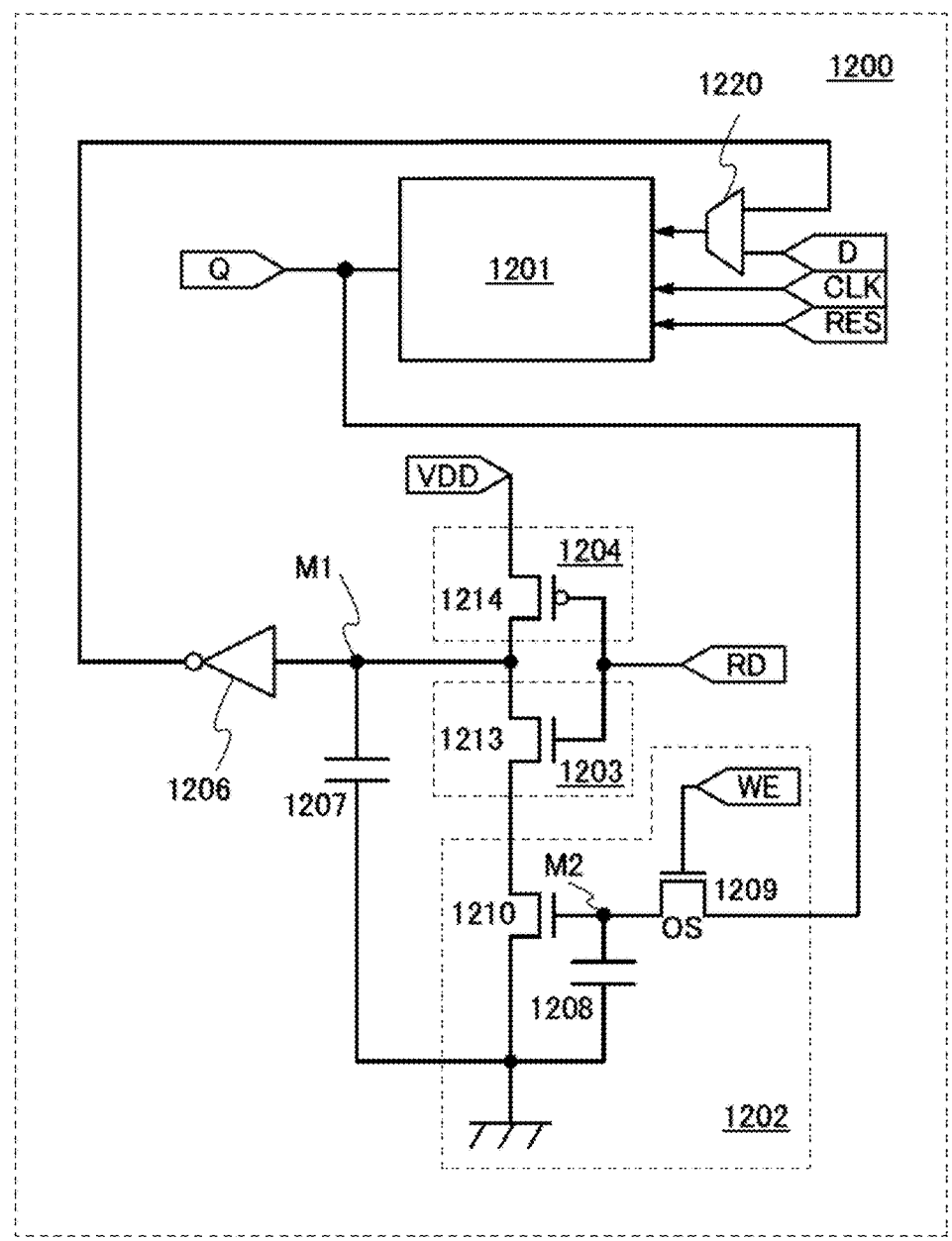
FIG. 28 is a circuit diagram of a semiconductor device of one embodiment of the present invention.

FIG. 28 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 28 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 28, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 28, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a film formed using a semiconductor other than an oxide semiconductor or in the substrate 1190 can be used for the rest of the transistors.

As the circuit 1201 in FIG. 28, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the transistor 1210 is brought into the on state or the off state depending on the signal retained by the capacitor 1208, and a signal corresponding to the state can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency identification (RF-ID).

<Display Device>

A display device of one embodiment of the present invention is described below with reference to FIGS. 29A to 29C and FIGS. 30A and 30B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 29A:
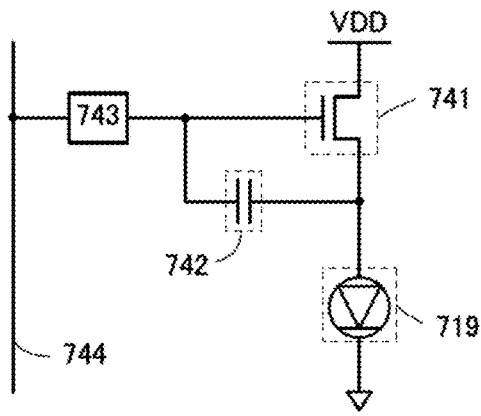
FIGS. 29A to 29C are a circuit diagram, a plan view, and a cross-sectional view illustrating a semiconductor device of one embodiment of the present invention.
Figure 29B:
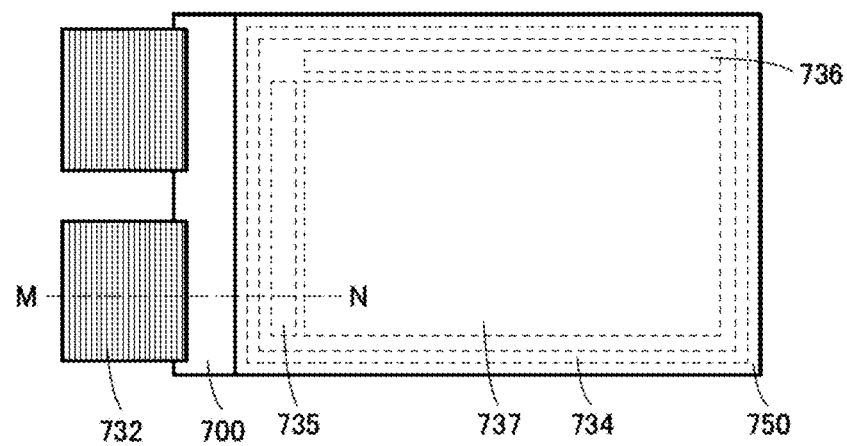
Figure 29C:
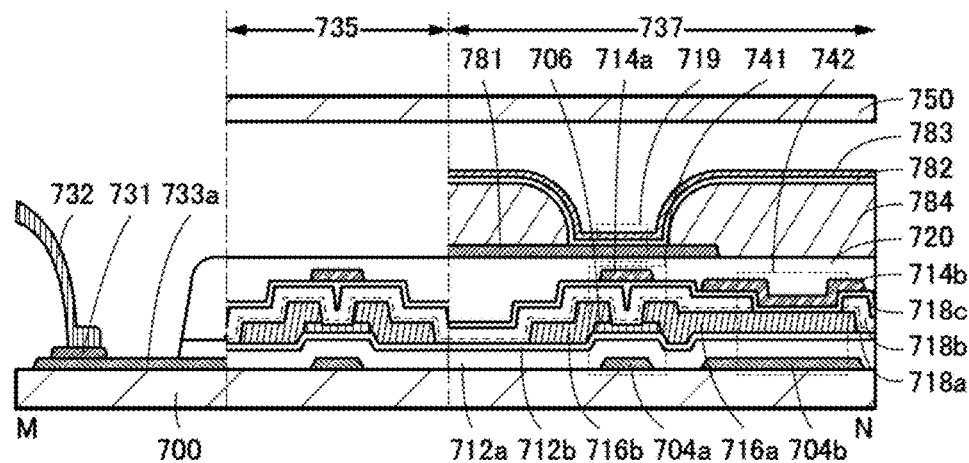

FIGS. 29A to 29C illustrate an example of an EL display device according to one embodiment of the present invention. FIG. 29A is a circuit diagram of a pixel in an EL display device. FIG. 29B is a plan view showing the whole of the EL display device.

FIG. 29A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 29A includes a switching element 743, a transistor 741, a capacitor 742, and a light-emitting element 719.

Note that FIG. 29A and the like each illustrate an example of a circuit structure; therefore, a transistor can be provided additionally. In contrast, for each node in FIG. 29A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 29B is a plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 29C is a cross-sectional view of the EL display device taken along part of dashed-dotted line M-N in FIG. 29B.

FIG. 29C illustrates a structure of the transistor 741 including a conductor 704*a* over the substrate 700; an insulator 712*a* over the conductor 704*a*; an insulator 712*b* over the insulator 712*a*; a semiconductor 706 that is over the insulator 712*b* and overlaps with the conductor 704*a*; a conductor 716*a* and a conductor 716*b* in contact with the semiconductor 706; an insulator 718*a* over the semiconductor 706, the conductor 716*a*, and the conductor 716*b*; an insulator 718*b* over the insulator 718*a*; an insulator 718*c* over the insulator 718*b*; and a conductor 714*a* that is over the insulator 718*c* and overlaps with the semiconductor 706. Note that the structure of the transistor 741 is just an example; the transistor 741 may have a structure different from that illustrated in FIG. 29C.

Thus, in the transistor 741 illustrated in FIG. 29C, the conductor 704*a* serves as a gate electrode, the insulator 712*a* and the insulator 712*b* serve as a gate insulator, the conductor 716*a* serves as a source electrode, the conductor 716*b* serves as a drain electrode, the insulator 718*a*, the insulator 718*b*, and the insulator 718*c* serve as a gate insulator, and the conductor 714*a* serves as a gate electrode. Note that in some cases, electrical characteristics of the semiconductor 706 change if light enters the semiconductor 706. To prevent this, it is preferable that one or more of the conductor 704*a*, the conductor 716*a*, the conductor 716*b*, and the conductor 714*a* have a light-blocking property.

Note that the interface between the insulator 718*a* and the insulator 718*b* is indicated by a broken line. This means that the boundary between them is not clear in some cases. For example, in the case where the insulator 718*a* and the insulator 718*b* are formed using insulators of the same kind, the insulator 718*a* and the insulator 718*b* are not distinguished from each other in some cases depending on an observation method.

FIG. 29C illustrates a structure of the capacitor 742 including a conductor 704*b* over the substrate; the insulator 712*a* over the conductor 704*b*; the insulator 712*b* over the insulator 712*a*; the conductor 716*a* that is over the insulator 712*b* and overlaps with the conductor 704*b*; the insulator 718*a* over the conductor 716*a*; the insulator 718*b* over the insulator 718*a*; the insulator 718*c* over the insulator 718*b*; and a conductor 714*b* that is over the insulator 718*c* and overlaps with the conductor 716*a*. In this structure, a part of the insulator 718*a* and a part of the insulator 718*b* are removed in a region where the conductor 716*a* and the conductor 714*b* overlap with each other.

In the capacitor 742, each of the conductor 704*b* and the conductor 714*b* serves as one electrode, and the conductor 716*a* serves as the other electrode.

Thus, the capacitor 742 can be formed using a film of the transistor 741. The conductor 704*a* and the conductor 704*b* are preferably conductors of the same kind, in which case the conductor 704*a* and the conductor 704*b* can be formed through the same step. Furthermore, the conductor 714*a* and the conductor 714*b* are preferably conductors of the same kind, in which case the conductor 714*a* and the conductor 714*b* can be formed through the same step.

The capacitor 742 illustrated in FIG. 29C has a large capacitance per area occupied by the capacitor. Therefore, the EL display device illustrated in FIG. 29C has high display quality. Note that although the capacitor 742 illustrated in FIG. 29C has the structure in which the part of the insulator 718*a* and the part of the insulator 718*b* are removed to reduce the thickness of the region where the conductor 716*a* and the conductor 714*b* overlap with each other, the structure of the capacitor according to one embodiment of the present invention is not limited to the structure. For example, a structure in which a part of the insulator 718*c* is removed to reduce the thickness of the region where the conductor 716*a* and the conductor 714*b* overlap with each other may be used.

An insulator 720 is provided over the transistor 741 and the capacitor 742. Here, the insulator 720 may have an opening reaching the conductor 716*a* that serves as the source electrode of the transistor 741. A conductor 781 is provided over the insulator 720. The conductor 781 may be electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

So far, examples of the EL display device are described. Next, an example of a liquid crystal display device is described.

Figure 30A:
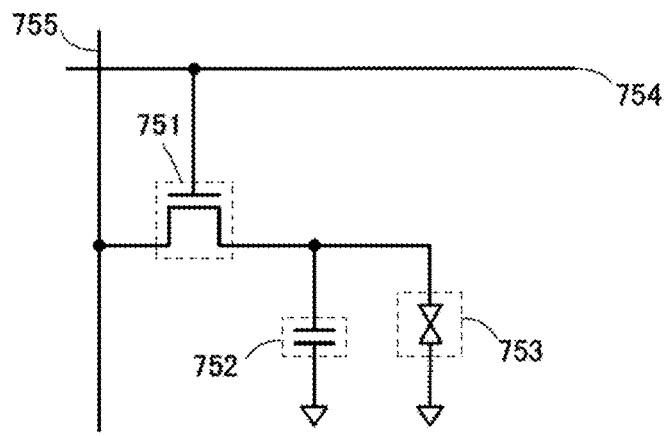
FIGS. 30A and 30B are a circuit diagram and a cross-sectional view illustrating a semiconductor device of one embodiment of the present invention.

FIG. 30A is a circuit diagram illustrating a configuration example of a pixel of a liquid crystal display device. A pixel shown in FIGS. 30A and 30B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 30B:
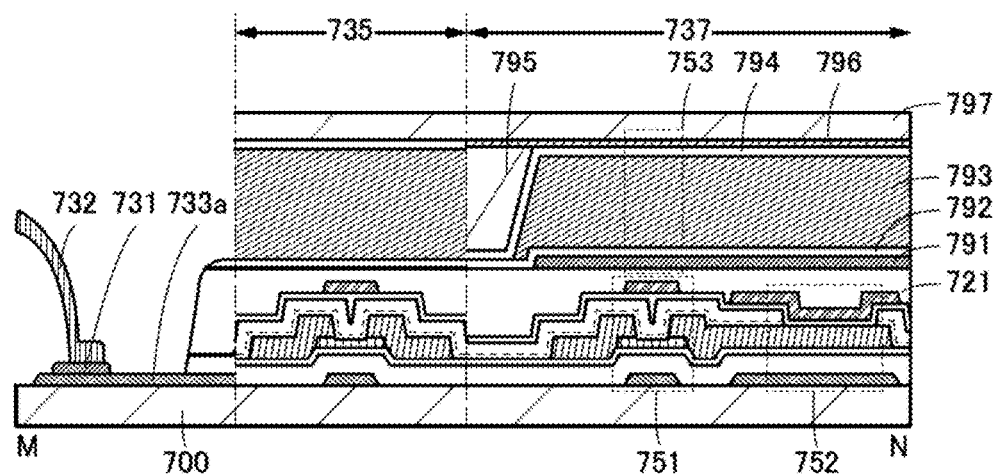

Note that the description of the liquid crystal display device is made on the assumption that the plan view of the liquid crystal display device is similar to that of the EL display device. FIG. 30B is a cross-sectional view of the liquid crystal display device taken along dashed-dotted line M-N in FIG. 29B. In FIG. 30B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 30B corresponds to, but is not limited to, the structure of the capacitor 742 in FIG. 29C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an EL element (e.g., an EL element including organic and inorganic materials, an organic EL element, or an inorganic EL element), a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, a display element including a carbon nanotube, and the like. Other than the above, display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device having electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 31A to 31F illustrate specific examples of these electronic devices.

Figure 31A:
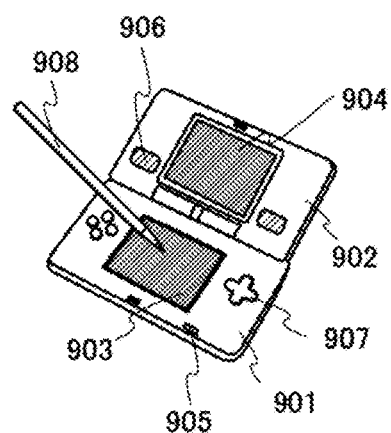
FIGS. 31A to 31F each illustrate an electronic device of one embodiment of the present invention.

FIG. 31A illustrates a portable game console including a housing 901, a housing 902, a display portion 903, a display portion 904, a microphone 905, a speaker 906, an operation key 907, a stylus 908, and the like. Although the portable game console in FIG. 31A has the two display portions 903 and 904, the number of display portions included in a portable game console is not limited to this.

Figure 31B:
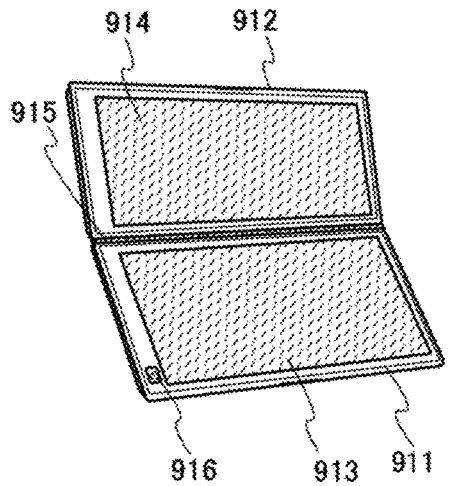

FIG. 31B illustrates a portable data terminal including a housing 911, a housing 912, a display portion 913, a display portion 914, a joint 915, an operation key 916, and the like. The display portion 913 is provided in the housing 911, and the display portion 914 is provided in the housing 912. The housing 911 and the housing 912 are connected to each other with the joint 915, and the angle between the housing 911 and the housing 912 can be changed with the joint 915. An image on the display portion 913 may be switched in accordance with the angle at the joint 915 between the housing 911 and the housing 912. A display device with a position input function may be used as at least one of the display portion 913 and the display portion 914. Note that the position input function can be added by providing a touch panel in a display device. Alternatively, the position input function can be added by providing a photoelectric conversion element called a photosensor in a pixel portion of a display device.

Figure 31C:
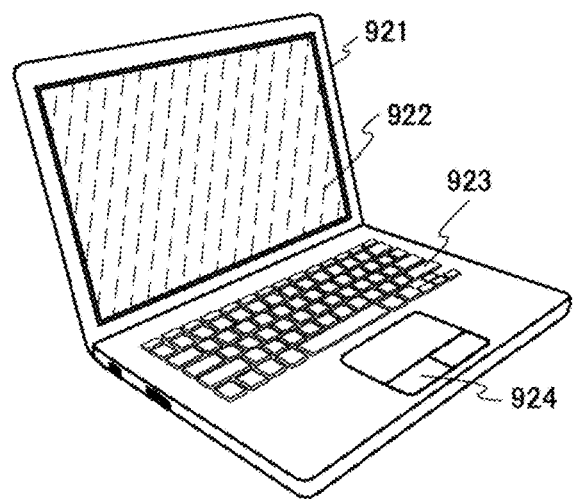

FIG. 31C illustrates a laptop personal computer, which includes a housing 921, a display portion 922, a keyboard 923, a pointing device 924, and the like.

Figure 31D:
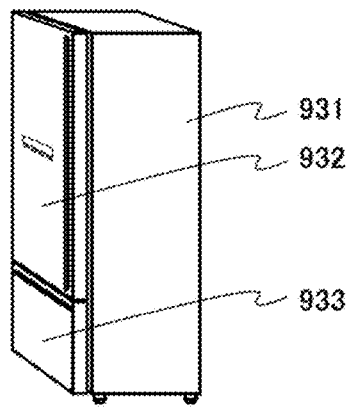

FIG. 31D illustrates an electric refrigerator-freezer, which includes a housing 931, a door for a refrigerator 932, a door for a freezer 933, and the like.

Figure 31E:
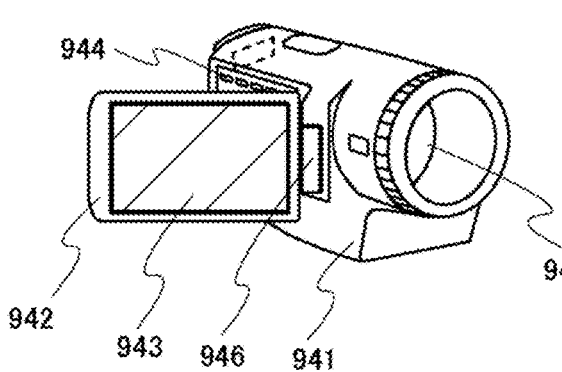

FIG. 31E illustrates a video camera, which includes a housing 941, a housing 942, a display portion 943, operation keys 944, a lens 945, a joint 946, and the like. The operation keys 944 and the lens 945 are provided for the housing 941, and the display portion 943 is provided for the housing 942. The housing 941 and the housing 942 are connected to each other with the joint 946, and the angle between the housing 941 and the housing 942 can be changed with the joint 946. Images displayed on the display portion 943 may be switched in accordance with the angle at the joint 946 between the housing 941 and the housing 942.

Figure 31F:
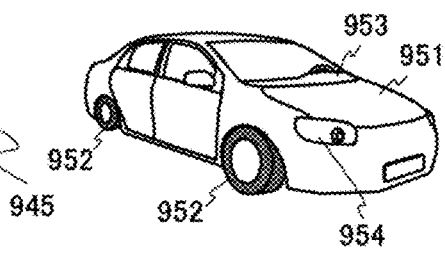

FIG. 31F illustrates a car including a car body 951, wheels 952, a dashboard 953, lights 954, and the like.

Example 1

In this example, dielectric constants of oxide semiconductors were evaluated by the density functional perturbation theory.

The following oxide semiconductors were calculated: zinc oxide, an In—Ga—Zn oxide with an atomic ratio In:Ga:Zn of 1:1:1, and an In—Ga—Zn oxide with an atomic ratio In:Ga:Zn of 3:1:2. The structure of zinc oxide used in the calculation included 4 atoms and the structures of the In—Ga—Zn oxides used in the calculation included 28 atoms.

Figure 32A:
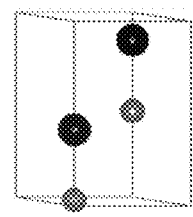
FIGS. 32A to 32F illustrate a structure of zinc oxide and structures of In—Ga—Zn oxides which were used for calculation.
Figure 32B:
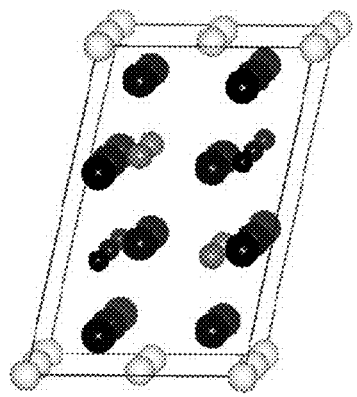
Figure 32C:
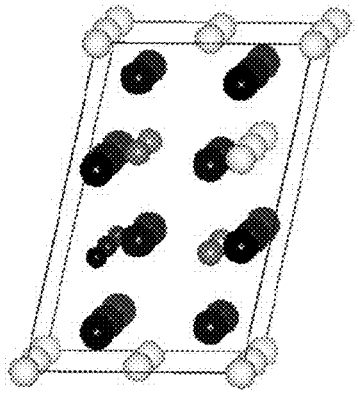
Figure 32D:
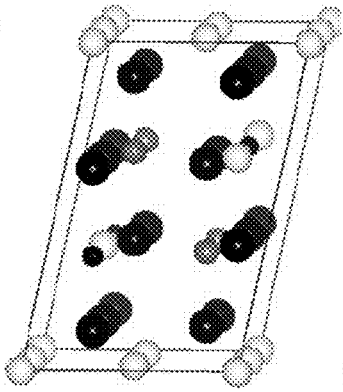
Figure 32E:
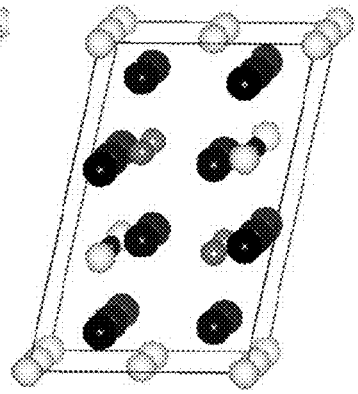
Figure 32F:

Zinc oxide with a wurtzite type structure was assumed (see FIG. 32A). As the In—Ga—Zn oxide with an atomic ratio In:Ga:Zn of 1:1:1, $InGaO_3(ZnO)_m$ having a homologous structure where m was 1 was assumed (see FIG. 32B). As the In—Ga—Zn oxide with an atomic ratio In:Ga:Zn of 3:1:2, the same structure as that of the In—Ga—Zn oxide with an atomic ratio In:Ga:Zn of 1:1:1 was assumed and the composition was adjusted by substituting In for Ga of the Ga—Zn—O layer. Thus, depending on the position where In is substituted for Ga, there are a plurality of structures. Here, three kinds of structures were assumed. The atomic arrangements before the structure optimization are shown in FIGS. 32C to 32E. FIG. 32C shows the structure where In atoms are substituted for all the Ga atoms positioned in one row in the Ga—Zn—O layer (Structure A). FIG. 32D shows the structure where an In atom and a Ga atom are arranged on the same a-c plane (Structure B). FIG. 32E shows the structure where In atoms are arranged on the same a-c plane and Ga atoms are arranged on another a-c plane (Structure C). Note that FIG. 32F shows the correspondence between symbols and elements.

Figure 33A:
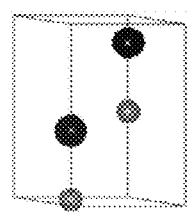
FIGS. 33A to 33F illustrate a structure of zinc oxide and structures of In—Ga—Zn oxides which were used for calculation.
Figure 33B:
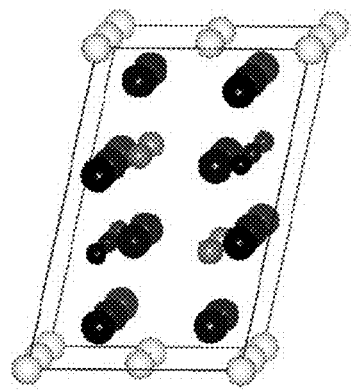
Figure 33C:
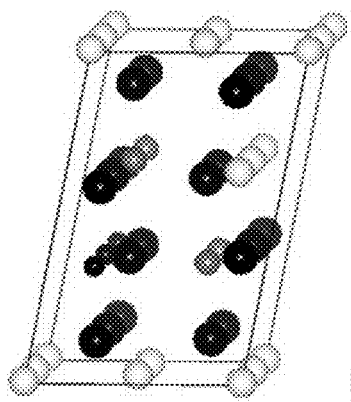
Figure 33D:
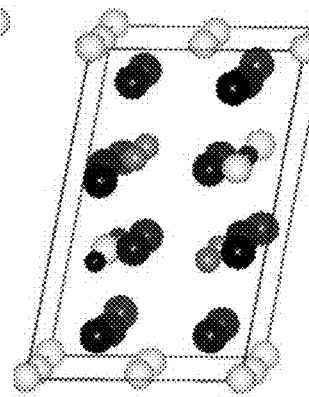
Figure 33E:
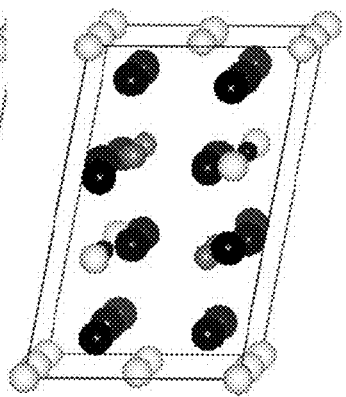
Figure 33F:

Next, the structures shown in FIGS. 32A to 32E were optimized by the first principles calculation. For the calculation, plane-wave basis first-principles calculation software Vienna ab-initio simulation package (VASP) was used. GGA-PBE was used as a functional. The cut-off energy of a plane wave was set at 800 eV in the case of zinc oxide and 600 eV in the case of the In—Ga—Zn oxides. The effect of an inner shell electron was included by a projector augmented wave (PAW) method. The structures after the optimization are shown in FIGS. 33A to 33E. Any large disorder did not occur in the assumed structures after the optimization. Note that at the structure optimization, a 24×24×16 k-point mesh was used for zinc oxide, and a 1×1×1 k-point mesh was used for the In—Ga—Zn oxides. Note that FIG. 33F shows the correspondence between symbols and elements.

The energy of the structures after the optimization of the In—Ga—Zn oxides with an atomic ratio In:Ga:Zn of 3:1:2 were as follows. The structure in FIG. 33C had −149.493 eV, the structure in FIG. 33D had −149.673 eV, and the structure in FIG. 33E had −149.810 eV. Thus, the structure in FIG. 33E, the structure in FIG. 33D, and the structure in FIG. 33C had more stabilized structures in this order.

Next, the static dielectric constants of the structures after the optimization were calculated. The results are shown in Table 1. The same calculation conditions as those used for the structure optimization were employed. Note that at this dielectric constant calculation, a 24×24×16 k-point mesh was used for zinc oxide, and a 11×9×6 k-point mesh was used for the In—Ga—Zn oxides.

TABLE 1

|  |  | Zinc oxide Calculated value | Zinc oxide ref Experimental value | In—Ga—Zn oxide (1:1:1) Calculated value | In—Ga—Zn oxide (3:1:2) Structure A Calculated value | In—Ga—Zn oxide (3:1:2) Structure B Calculated value | In—Ga—Zn oxide (3:1:2) Structure C Calculated value |
|---|---|---|---|---|---|---|---|
| Contribution of electrons to dielectric constant | $\varepsilon^\infty xx$ | 5.14 | 3.70 | 4.46 | 4.75 | 4.70 | 4.70 |
|  | $\varepsilon^\infty yy$ | 5.14 | 3.70 | 4.63 | 4.91 | 4.88 | 4.87 |
|  | $\varepsilon^\infty zz$ | 5.19 | 3.78 | 4.58 | 4.94 | 4.84 | 4.87 |
| Contribution of ions to | $\varepsilon^0 xx - \varepsilon^\infty xx$ | 4.71 | 4.07 | 5.04 | 5.08 | 5.14 | 5.17 |
|  | $\varepsilon^0 yy - \varepsilon^\infty yy$ | 4.71 | 4.07 | 6.85 | 7.53 | 7.74 | 7.43 |

TABLE 1-continued

|  |  | Zinc oxide Calculated value | Zinc oxide ref Experimental value | In—Ga—Zn oxide (1:1:1) Calculated value | In—Ga—Zn oxide (3:1:2) Structure A Calculated value | In—Ga—Zn oxide (3:1:2) Structure B Calculated value | In—Ga—Zn oxide (3:1:2) Structure C Calculated value |
|---|---|---|---|---|---|---|---|
| dielectric constant | $\varepsilon^0 zz - \varepsilon^\infty zz$ | 5.53 | 5.13 | 11.56 | 12.38 | 15.25 | 19.75 |
| Static dielectric constant | $\varepsilon^0_{xx}$ | 9.85 | 7.77 | 9.50 | 9.84 | 9.84 | 9.87 |
|  | $\varepsilon^0_{yy}$ | 9.85 | 7.77 | 11.47 | 12.44 | 12.62 | 12.30 |
|  | $\varepsilon^0_{zz}$ | 10.72 | 8.91 | 16.13 | 17.32 | 20.09 | 24.62 |

When focusing on zinc oxide, the static dielectric constant $\varepsilon_0//c$ (also represented as $\varepsilon^0_{33}$ or $\varepsilon^0_{zz}$) in the direction parallel to the c-axis was slightly higher but substantially the same as the static dielectric constant $\varepsilon^0 \perp c$ (also represented as $\varepsilon^0_{11}$ or $\varepsilon^0_{xx}$, and $\varepsilon^0_{22}$ or $\varepsilon^0_{yy}$) in the directions perpendicular to the c-axis. The experimental values of zinc oxide are also noted in Table 1 (refer to J. Wrobel, Krzysztof J. Kurzydlowski, K. Hummer, G. Kresse, and J. Piechota, Physical Review B 80, 155124 (2009)). The comparison between the calculated values and the experimental values proves that the calculated values are consistent with the experimental values. Note that when the absolute values of the static dielectric constants are paid attention to, the calculated values are estimated to be higher than the experimental values. This is owing to the underestimation of the energy gap by the employed calculation method. Thus, the calculated static dielectric constants are relative values and the actual values might be a little lower that the calculated values. Note that $\varepsilon^0_{xx}$, $\varepsilon^0_{yy}$, and $\varepsilon^0_{zz}$ represent static dielectric constants in directions orthogonal to one another.

Next, when focusing on the In—Ga—Zn oxides, in each of the conditions, the static dielectric constant $\varepsilon^0_{yy}$ in the direction parallel to the c-axis is large and the static dielectric constants $\varepsilon^0_{xx}$ and $\varepsilon^0_{yy}$ in the directions perpendicular to the c-axis are low. In other words, $\varepsilon^0_{xx}$ and $\varepsilon^0_{yy}$ are lower than $\varepsilon^0_{zz}$. Although only the calculated values are shown here as for the In—Ga—Zn oxides, the absolute values of the static dielectric constants of the In—Ga—Zn oxides can be obtained from the comparison with the experimental values.

This example shows that crystals of the In—Ga—Zn oxides have dielectric anisotropy. Thus, for example, an In—Ga—Zn oxide having alignment probably has dielectric anisotropy.

Example 2

In this example, a relation between the dielectric constant of a channel formation region and electrical characteristics of the transistor was evaluated by calculation.

Figure 34A:
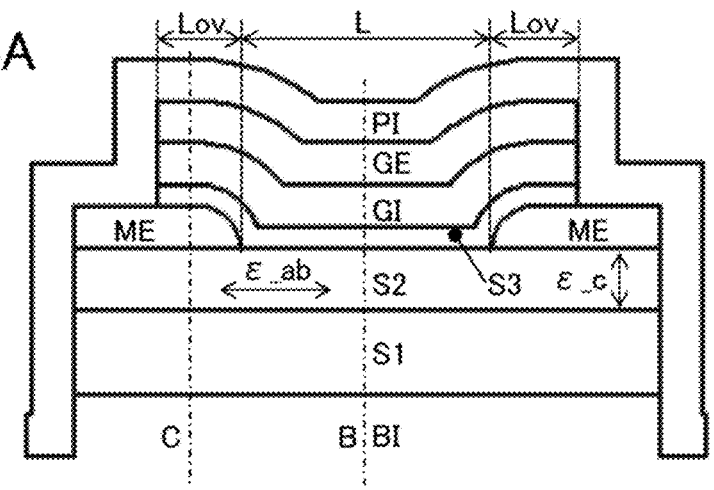
FIGS. 34A to 34C are cross-sectional views illustrating a structure of a transistor used for calculation.
Figure 34B:
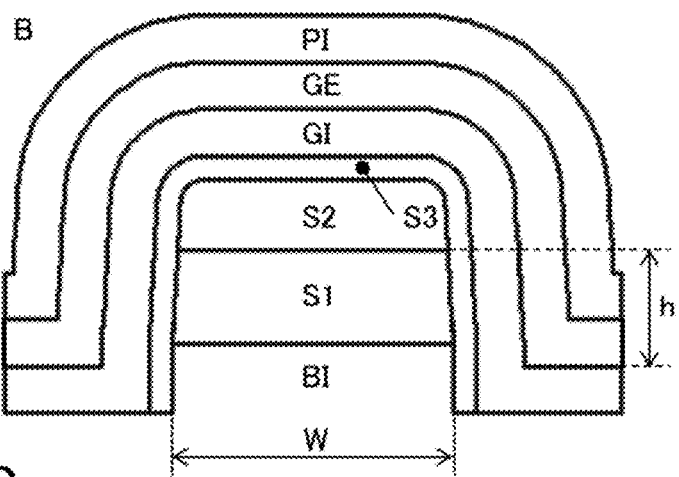
Figure 34C:
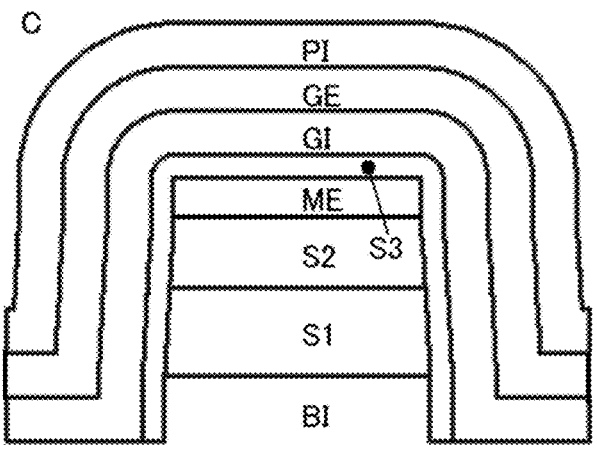

FIGS. 34A to 34C are cross-sectional views of a transistor having a three-dimensional structure which was subjected to electrical characteristic calculation. FIG. 34A is a cross-sectional view in the channel length direction. FIG. 34B is a cross-sectional view taken along dashed-dotted line B in FIG. 34A. FIG. 34C is a cross-sectional view taken along dashed-dotted line C in FIG. 34A.

As illustrated in FIG. 34A, the transistor includes a first insulator (represented by BI), a first semiconductor (represented by S1), a second semiconductor (represented by S2) over S1, a first conductor and a second conductor (both represented by ME) over S2, a third semiconductor (represented by S3) over S2 and ME, a second insulator (represented by GI) over S3, and a third conductor (represented by GE) over GI.

In addition, the transistor is covered with a third insulator (represented by PI). In FIG. 34A, the length between two MEs is the channel length (also represented by L). In addition, the length of a region where ME and GE overlap with each other is an overlap length (also represented by $L_{ov}$).

Note that S2 functions as a channel formation region. ME functions as a source electrode or a drain electrode. Furthermore, GI functions as a gate insulator. Moreover, GE functions as a gate electrode.

The relative dielectric constant of S2 in the vertical direction (e.g., c-axis direction) in FIG. 34A is represented by $\varepsilon\_c$. The relative dielectric constant of S2 in the horizontal direction (e.g., a- and b-axis directions) is represented by $\varepsilon\_ab$. Also in FIGS. 34B and 34C, the relative dielectric constant of S2 in the vertical direction is $\varepsilon\_c$, and the relative dielectric constant of S2 in the horizontal direction is $\varepsilon\_ab$ (not shown).

In FIG. 34B, the length of a bottom portion of S1 is a channel width (also represented by W). As illustrated in FIG. 34B, a top and side surfaces of S2 face GE with S3 and GI positioned therebetween. Note that the height from the bottom surface of S2 to the interface between GE and GI (the lowest surface of GE) is represented by h.

As illustrated in FIGS. 34A and 34C, ME does not have a region in contact with the side surface of S2.

As a calculation software, Sentaurus Device manufactured by Synopsys, Inc. was used. The following table shows conditions used for the calculation.

TABLE 2

| Structure | | |
|---|---|---|
|  | L | 60 nm |
|  | Lov | 20 nm |
|  | Length of OS island | 140 nm |
|  | W | 30, 60, 90, 120, 150, 180 nm |
|  | h | 25 nm |
| PI | Relative dielectric constant | 4.1 |
|  | Thickness | 10 nm |
| GE | Work function | 5.0 eV |
| GI | Relative dielectric constant | 4.1 |
|  | Thickness | 10 nm |
| S3 | Electron affinity | 4.3 eV |
|  | Energy gap | 3.7 eV |
|  | Relative dielectric constant | 15 |
|  | Donor density | 6.60E−09 $cm^{-3}$ |
|  | Electron mobility | 0.1 $cm^2/Vs$ |
|  | Hole mobility | 0.01 $cm^2/Vs$ |
|  | Nc | 5.00E+18 $cm^{-3}$ |
|  | Nv | 5.00E+18 $cm^{-3}$ |
|  | Thickness | 5 nm |

TABLE 2-continued

| | | |
|---|---|---|
| S2 | Electron affinity | 4.6 eV |
| | Energy gap | 3.2 eV |
| | Relative dielectric constant in c-axis direction | 15 |
| | Relative dielectric constant in a- and b-axis directions | 15, 10, 5 |
| | Donor density | 6.60E−09 cm$^{-3}$ |
| | Donor density (under SD) | 5.00E+18 cm$^{-3}$ |
| | Electron mobility | 10 cm$^2$/Vs |
| | Hole mobility | 0.01 cm$^2$/Vs |
| | Nc | 5.00E+18 cm$^{-3}$ |
| | Nv | 5.00E+18 cm$^{-3}$ |
| | Thickness | 15 nm |
| S1 (=S3) | Thickness | 20 nm |
| BI | Relative dielectric constant | 4.1 |
| | Thickness | 400 nm |
| BG | Work function | 5.0 eV |
| | Applied voltage | 0 V |
| ME | Work function | 4.6 eV |
| | Thickness | 10 nm |

Note that a low-resistance region (also represented by a region under ME) with a thickness of 1 nm was provided in S2 in the vicinity of the interface between S2 and ME. In addition, a backgate electrode (also represented by BG) for fixing the potential was provided blow BI. Note that $N_c$ represents the effective density of states in the conduction band, and $N_v$ represents the effective density of states in the valence band.

Figure 35A:
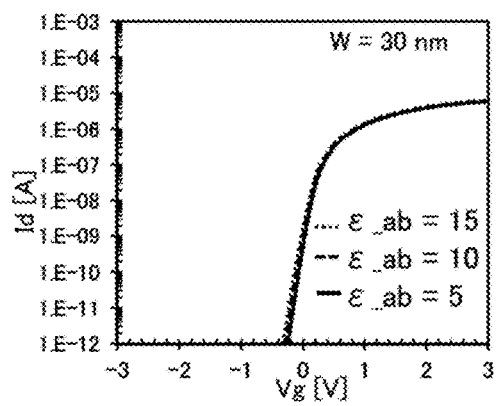
FIGS. 35A to 35F show electrical characteristics of transistors.
Figure 35B:
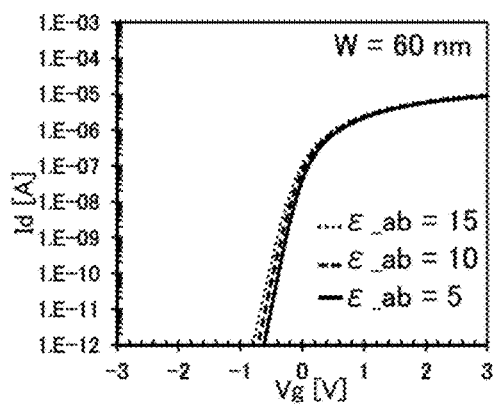
Figure 35C:
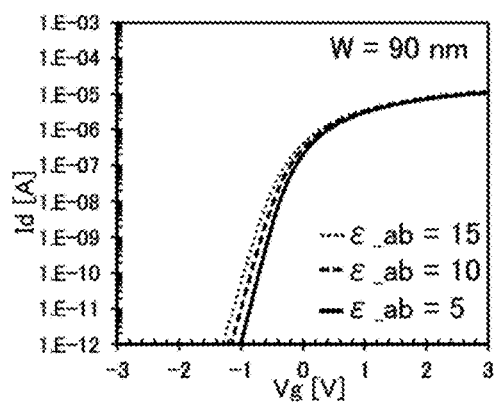
Figure 35D:
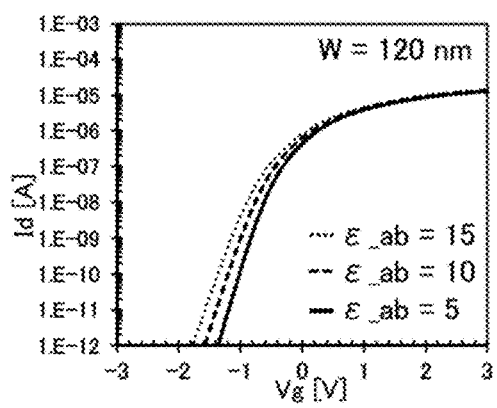
Figure 35E:
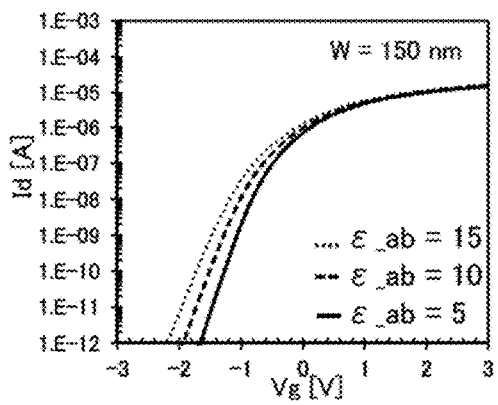
Figure 35F:
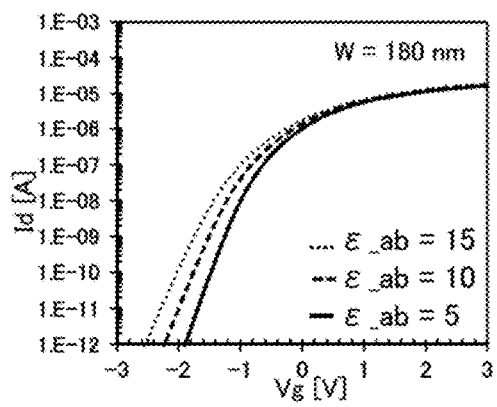

FIGS. 35A to 35F show $I_d$-$V_g$ characteristics obtained by calculation. Note that the drain voltage $V_d$ was set at 1.8 V. FIG. 35A shows $I_d$-$V_g$ characteristics of when W is 30 nm. FIG. 35B shows $I_d$-$V_g$ characteristics of when W is 60 nm. FIG. 35C shows $I_d$-$V_g$ characteristics of when W is 90 nm. FIG. 35D shows $I_d$-$V_g$ characteristics of when W is 120 nm. FIG. 35E shows $I_d$-$V_g$ characteristics of when W is 150 nm. FIG. 35F shows $I_d$-$V_g$ characteristics of when W is 180 nm.

Figure 36A:
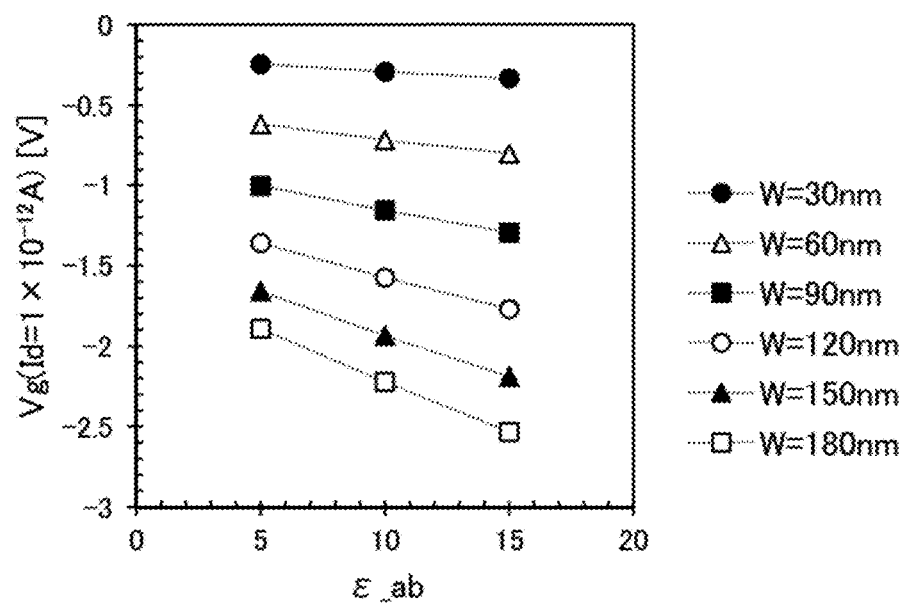
FIGS. 36A and 36B show electrical characteristics of transistors.

From the $I_d$-$V_g$ characteristics in FIGS. 35A to 35F, a relation between the gate voltage $V_g$ and ε_ab at the drain current $I_d$ of 1×10$^{-12}$ A was obtained and shown in FIG. 36A. FIG. 36A indicates that at any channel width, the gate voltage $V_g$ at the drain current $I_d$ of 1×10$^{-12}$ A becomes higher as ε_ab becomes smaller.

Figure 36B:
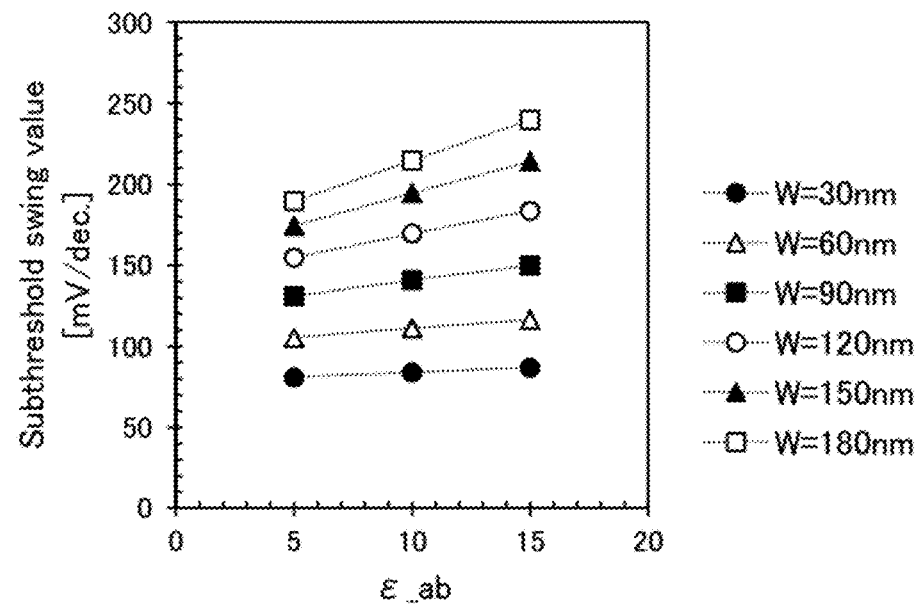
Figure 37A:
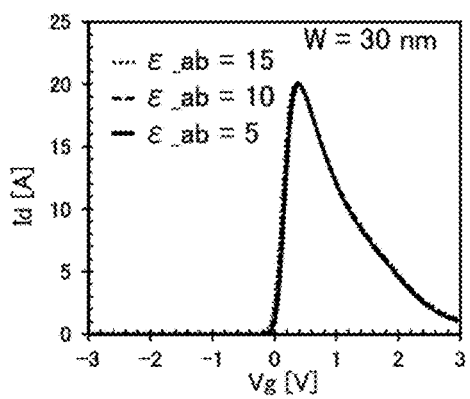
FIGS. 37A to 37F show electrical characteristics of transistors.
Figure 37B:
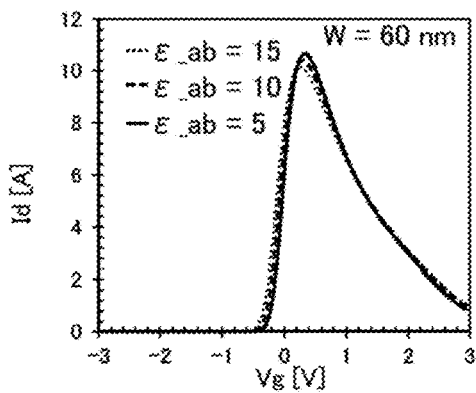
Figure 37C:
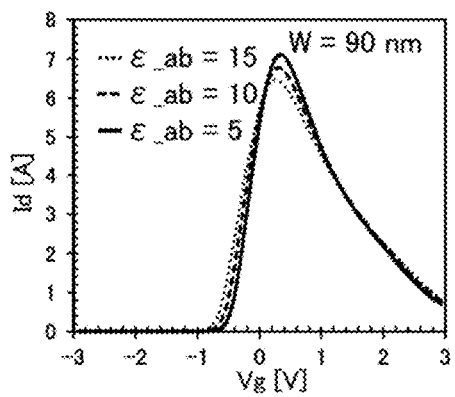
Figure 37D:
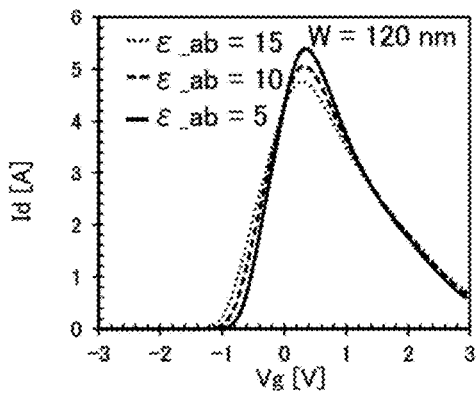
Figure 37E:
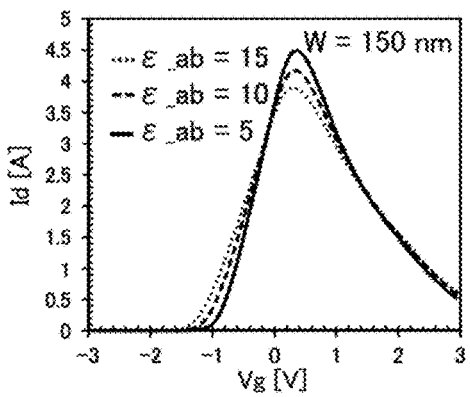
Figure 37F:
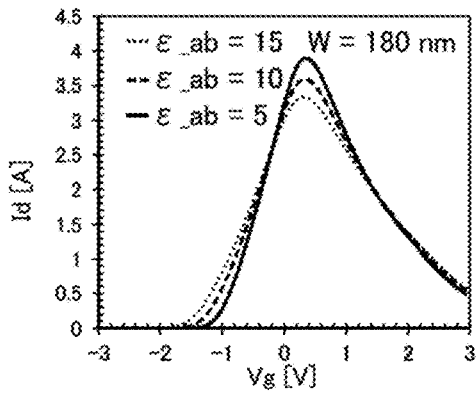

Moreover, from the $I_d$-$V_g$ characteristics in FIGS. 35A to 35F, a relation between the subthreshold swing value and ε_ab was obtained and shown in FIG. 36B. FIG. 36B indicates that at any channel width, the subthreshold swing value becomes lower as ε_ab becomes smaller.

Next, from the $I_d$-$V_g$ characteristics in FIGS. 35A to 35F, the field-effect mobility of the transistors was obtained (see FIGS. 37A to 37F). Note that FIG. 35A, FIG. 35B, FIG. 35C, FIG. 35D, FIG. 35E, and FIG. 35F correspond to FIG. 37A, FIG. 37B, FIG. 37C, FIG. 37D, FIG. 37E, and FIG. 37F, respectively.

FIGS. 37A to 37F indicates that at any channel width, the field-effect mobility becomes higher as ε_ab becomes smaller.

From the description above, it can be found that in the case where ε_ab is varied with ε_c fixed, electrical characteristics of a transistor become higher as ε_ab becomes smaller.

This application is based on Japanese Patent Application serial no. 2014-158032 filed with Japan Patent Office on Aug. 1, 2014, the entire contents of which are hereby incorporated by reference.

What is claimed is:

1. A semiconductor device having a transistor, the transistor comprising:
a first gate electrode;
a first gate insulating layer over the first gate electrode;
an oxide semiconductor stack including a first oxide semiconductor on the first gate insulating layer, a second oxide semiconductor on the first oxide semiconductor, and a third oxide semiconductor on the second oxide semiconductor;
a source electrode and a drain electrode on the oxide semiconductor stack;
a second gate insulating layer over the source electrode, the drain electrode, and the oxide semiconductor stack; and
a second gate electrode on the second gate insulating layer,
wherein an end of the source electrode and a first end of the oxide semiconductor stack are aligned with each other,
wherein an end of the drain electrode and a second end of the oxide semiconductor stack are aligned with each other, and
wherein a first dielectric constant of a part of the oxide semiconductor stack in a first direction perpendicular to a top surface of the oxide semiconductor stack is higher than a second dielectric constant of the part of the oxide semiconductor stack in a second direction parallel to the top surface.

2. The semiconductor device according to claim 1,
wherein the oxide semiconductor stack comprises a crystal part, and
wherein a crystal axis of the crystal part has orientation.

3. The semiconductor device according to claim 1,
wherein the first direction is a thickness direction of the oxide semiconductor stack, and
wherein the second direction is one of a channel width direction and a channel length direction of the transistor.

4. The semiconductor device according to claim 1,
wherein the oxide semiconductor stack comprises indium, zinc, and gallium.

5. The semiconductor device according to claim 1,
wherein the oxide semiconductor stack is provided on a projection of the first gate insulating layer.

6. The semiconductor device according to claim 1,
wherein the third oxide semiconductor has dielectric anisotropy.

7. A semiconductor device having a transistor, the transistor comprising:
a first gate electrode;
a first gate insulating layer over the first gate electrode;
an oxide semiconductor stack including a first oxide semiconductor on the first gate insulating layer, a second oxide semiconductor on the first oxide semiconductor, and a third oxide semiconductor on the second oxide semiconductor;
a source electrode and a drain electrode on the oxide semiconductor stack;
a second gate insulating layer over the source electrode, the drain electrode, and the oxide semiconductor stack; and
a second gate electrode on the second gate insulating layer,
wherein an end of the source electrode and a first end of the oxide semiconductor stack are aligned with each other, wherein an end of the drain electrode and a second end of the oxide semiconductor stack are aligned with each other, wherein the oxide semiconductor stack comprises part including a crystal structure having a first crystal axis and a second crystal axis, and wherein in the crystal structure, a first dielectric constant in the direction of the first crystal axis is higher than a second dielectric constant in the direction of the second crystal axis.

8. The semiconductor device according to claim 7, wherein the first crystal axis is aligned in a direction parallel to a normal vector of a top surface of the oxide semiconductor stack.

9. The semiconductor device according to claim 7, wherein the oxide semiconductor stack comprises indium, zinc, and gallium.

10. The semiconductor device according to claim 7, wherein the oxide semiconductor stack is provided on a projection of the first gate insulating layer.

11. The semiconductor device according to claim 7, wherein the third oxide semiconductor has dielectric anisotropy.

12. The semiconductor device according to claim 1, wherein each of the source electrode and the drain electrode is provided on the third oxide semiconductor.

13. The semiconductor device according to claim 1, wherein each of the source electrode and the drain electrode is provided between the second oxide semiconductor and the third oxide semiconductor.

14. The semiconductor device according to claim 7, wherein each of the source electrode and the drain electrode is provided on the third oxide semiconductor.

15. The semiconductor device according to claim 7, wherein each of the source electrode and the drain electrode is provided between the second oxide semiconductor and the third oxide semiconductor.

* * * * *